United States Patent
Kim et al.

(10) Patent No.: US 9,933,871 B2
(45) Date of Patent: Apr. 3, 2018

(54) SENSOR SUBSTRATE AND SENSING DISPLAY PANEL HAVING THE SAME

(71) Applicant: Samsung Display Co., Ltd., Yongin-si (KR)

(72) Inventors: In-Cheol Kim, Asan-si (KR); Ji-Hong Park, Suwon-si (KR); Hyun-Ju Lee, Seoul (KR); Il-Ho Lee, Hwaseong-si (KR); Moon-Sung Choi, Incheon (KR); Seong-Mo Hwang, Seongnam-si (KR); Ki-Hyuk Kim, Seoul (KR); Seung-Ho Nam, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

(21) Appl. No.: 14/923,960

(22) Filed: Oct. 27, 2015

(65) Prior Publication Data
US 2016/0048048 A1    Feb. 18, 2016

Related U.S. Application Data

(62) Division of application No. 13/705,703, filed on Dec. 5, 2012, now Pat. No. 9,202,949.

(30) Foreign Application Priority Data

Jun. 21, 2012    (KR) .......................... 10-2012-0066942

(51) Int. Cl.
*G06F 3/041*    (2006.01)
*G02F 1/1362*    (2006.01)
(Continued)

(52) U.S. Cl.
CPC ........ *G06F 3/0412* (2013.01); *G02F 1/13338* (2013.01); *G02F 1/136204* (2013.01);
(Continued)

(58) Field of Classification Search
CPC ....... G06F 3/0412; G06F 3/0416; G06F 3/044
See application file for complete search history.

(56) References Cited

U.S. PATENT DOCUMENTS 6,501,529 B1 * 12/2002 Kurihara ............. G02F 1/13338
345/173
7,924,350 B2 * 4/2011 Ma ...................... G02F 1/13338
349/12
(Continued)

FOREIGN PATENT DOCUMENTS

KR    10-0887510    2/2009
KR    10-2011-0100377    9/2011

OTHER PUBLICATIONS

Non-Final Office Action dated Mar. 14, 2014, in U.S. Appl. No. 13/705,703.
(Continued)

*Primary Examiner* — Patrick F Marinelli
(74) *Attorney, Agent, or Firm* — H.C. Park & Associates, PLC

(57) ABSTRACT

A sensor substrate includes a base substrate, a black matrix pattern, a sensing electrode pattern, a driving electrode pattern, and at least one bridge line. The black matrix pattern is disposed on the base substrate and divides the base substrate into a light transmission area and a light blocking area. The sensing electrode pattern includes a plurality of first unit patterns arranged in association with a first direction. The driving electrode pattern includes a plurality of second unit patterns arranged in association with a second direction and disposed adjacent to the plurality of first unit patterns. The at least one bridge line is connected between at least two of the plurality of first unit patterns or between at least two of the plurality of second unit patterns.

12 Claims, 27 Drawing Sheets

(51) Int. Cl.
*H01L 27/12* (2006.01)
*H01L 23/02* (2006.01)
*G06F 3/044* (2006.01)
*H01L 27/146* (2006.01)
*G02F 1/1333* (2006.01)
*H01L 31/0232* (2014.01)
*H01L 31/12* (2006.01)
*H01L 27/02* (2006.01)

(52) U.S. Cl.
CPC ............ *G06F 3/044* (2013.01); *H01L 27/027* (2013.01); *H01L 27/1214* (2013.01); *H01L 27/14623* (2013.01); *H01L 31/0232* (2013.01); *H01L 31/12* (2013.01); *G06F 2203/04112* (2013.01)

(56) References Cited

U.S. PATENT DOCUMENTS

| | | | | |
|---|---|---|---|---|
| 8,243,027 | B2* | 8/2012 | Hotelling | G02F 1/13338 345/104 |
| 8,451,244 | B2* | 5/2013 | Hotelling | G06F 3/0412 345/104 |
| 8,717,508 | B2* | 5/2014 | Yu | G06F 3/0412 349/12 |
| 8,804,056 | B2* | 8/2014 | Chang | G06F 3/0412 345/174 |
| 8,922,521 | B2* | 12/2014 | Hotelling | G06F 1/3218 178/18.06 |
| 8,933,898 | B2* | 1/2015 | Lee | G06F 3/0412 345/173 |
| 8,982,083 | B2* | 3/2015 | Kim | G06F 3/044 345/173 |
| 9,019,215 | B2* | 4/2015 | Hwang | G06F 3/0412 345/173 |
| 9,041,869 | B2* | 5/2015 | Kim | G06F 3/044 257/432 |
| 9,128,712 | B2* | 9/2015 | Singh | G06F 1/3218 |
| 9,202,949 | B2* | 12/2015 | Kim | H01L 31/0232 |
| 9,250,735 | B2* | 2/2016 | Kim | G06F 3/0412 |
| 9,268,358 | B2* | 2/2016 | Kim | G06F 3/044 |
| 9,442,330 | B2* | 9/2016 | Huo | G02F 1/13338 |
| 9,639,205 | B2* | 5/2017 | Kim | G09G 3/3696 |
| 2008/0062147 | A1 | 3/2008 | Hotelling et al. | |
| 2008/0309633 | A1* | 12/2008 | Hotelling | G06F 3/0412 345/173 |
| 2009/0322702 | A1 | 12/2009 | Chien et al. | |
| 2010/0110023 | A1* | 5/2010 | Chien | G02B 5/201 345/173 |
| 2010/0149116 | A1* | 6/2010 | Yang | G06F 3/0416 345/173 |
| 2010/0149117 | A1 | 6/2010 | Chien et al. | |
| 2011/0090159 | A1 | 4/2011 | Kurashima | |
| 2011/0260992 | A1* | 10/2011 | Hung | G06F 3/041 345/173 |
| 2012/0086654 | A1* | 4/2012 | Song | G06F 3/0412 345/173 |
| 2012/0086665 | A1* | 4/2012 | Song | G02F 1/13338 345/174 |
| 2012/0086879 | A1* | 4/2012 | Yu | G06F 3/0412 349/33 |
| 2012/0105337 | A1* | 5/2012 | Jun | G06F 3/0412 345/173 |
| 2012/0169647 | A1 | 7/2012 | Kuo | |
| 2012/0218199 | A1* | 8/2012 | Kim | G06F 3/0412 345/173 |
| 2012/0242597 | A1* | 9/2012 | Hwang | G06F 3/0412 345/173 |
| 2012/0249444 | A1* | 10/2012 | Lee | G06F 3/0412 345/173 |
| 2012/0274603 | A1* | 11/2012 | Kim | G06F 3/0412 345/173 |
| 2013/0033439 | A1* | 2/2013 | Kim | G02F 1/13338 345/173 |
| 2013/0063404 | A1* | 3/2013 | Jamshidi Roudbari | G06F 3/044 345/204 |
| 2013/0162570 | A1* | 6/2013 | Shin | G06F 3/041 345/173 |
| 2013/0314371 | A1* | 11/2013 | Lee | G06F 3/0412 345/174 |
| 2013/0328812 | A1* | 12/2013 | Kim | G06F 3/044 345/173 |
| 2013/0335366 | A1* | 12/2013 | Lee | G06F 3/044 345/174 |
| 2013/0341651 | A1* | 12/2013 | Kim | H01L 31/0232 257/84 |
| 2014/0043247 | A1* | 2/2014 | Singh | G06F 1/3218 345/173 |
| 2014/0070350 | A1* | 3/2014 | Kim | G06F 3/0412 257/432 |
| 2014/0071360 | A1* | 3/2014 | Chang | G06F 3/0412 349/12 |
| 2015/0002752 | A1* | 1/2015 | Shepelev | G06F 3/044 349/12 |
| 2015/0029118 | A1* | 1/2015 | Xu | G06F 3/044 345/173 |
| 2015/0185936 | A1* | 7/2015 | Kim | G06F 3/0412 345/174 |
| 2015/0234425 | A1* | 8/2015 | Kim | G06F 1/16 345/174 |
| 2015/0309630 | A1* | 10/2015 | Yang | G02F 1/1333 345/206 |
| 2016/0048048 | A1* | 2/2016 | Kim | H01L 31/0232 257/89 |
| 2016/0132166 | A1* | 5/2016 | Kim | G06F 3/0412 345/173 |
| 2016/0252996 | A1* | 9/2016 | Jiang | G06F 3/0418 |
| 2016/0259195 | A1* | 9/2016 | Shin | G06F 3/041 |
| 2016/0274721 | A1* | 9/2016 | Ding | G06F 3/044 |
| 2016/0357313 | A1* | 12/2016 | Yang | G06F 3/044 |

OTHER PUBLICATIONS

Final Office Action dated Sep. 18, 2014, in U.S. Appl. No. 13/705,703.
Non-Final Office Action dated Mar. 13, 2015, in U.S. Appl. No. 13/705,703.
Notice of Allowance dated Aug. 17, 2015, in U.S. Appl. No. 13/705,703.

* cited by examiner

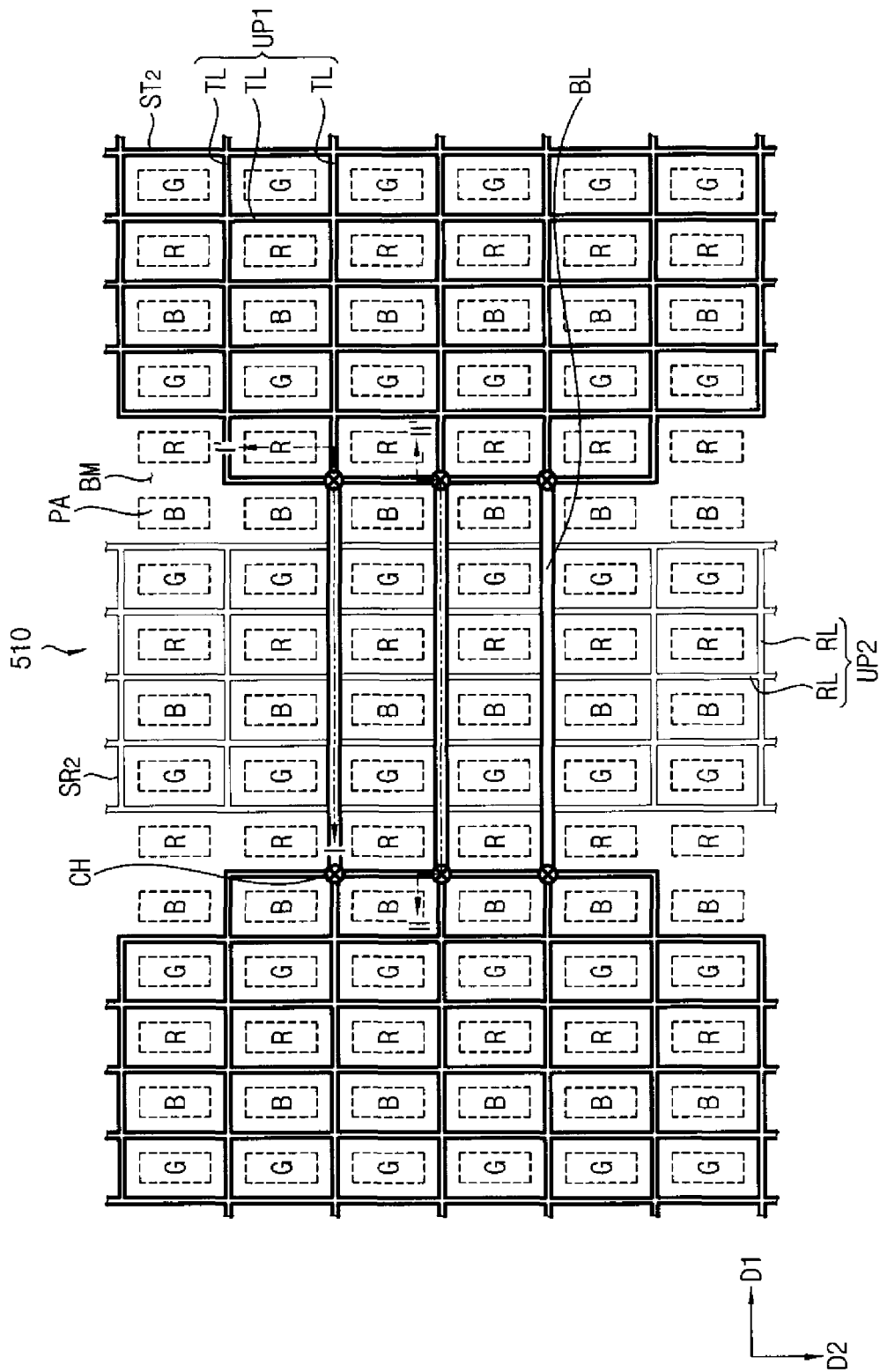

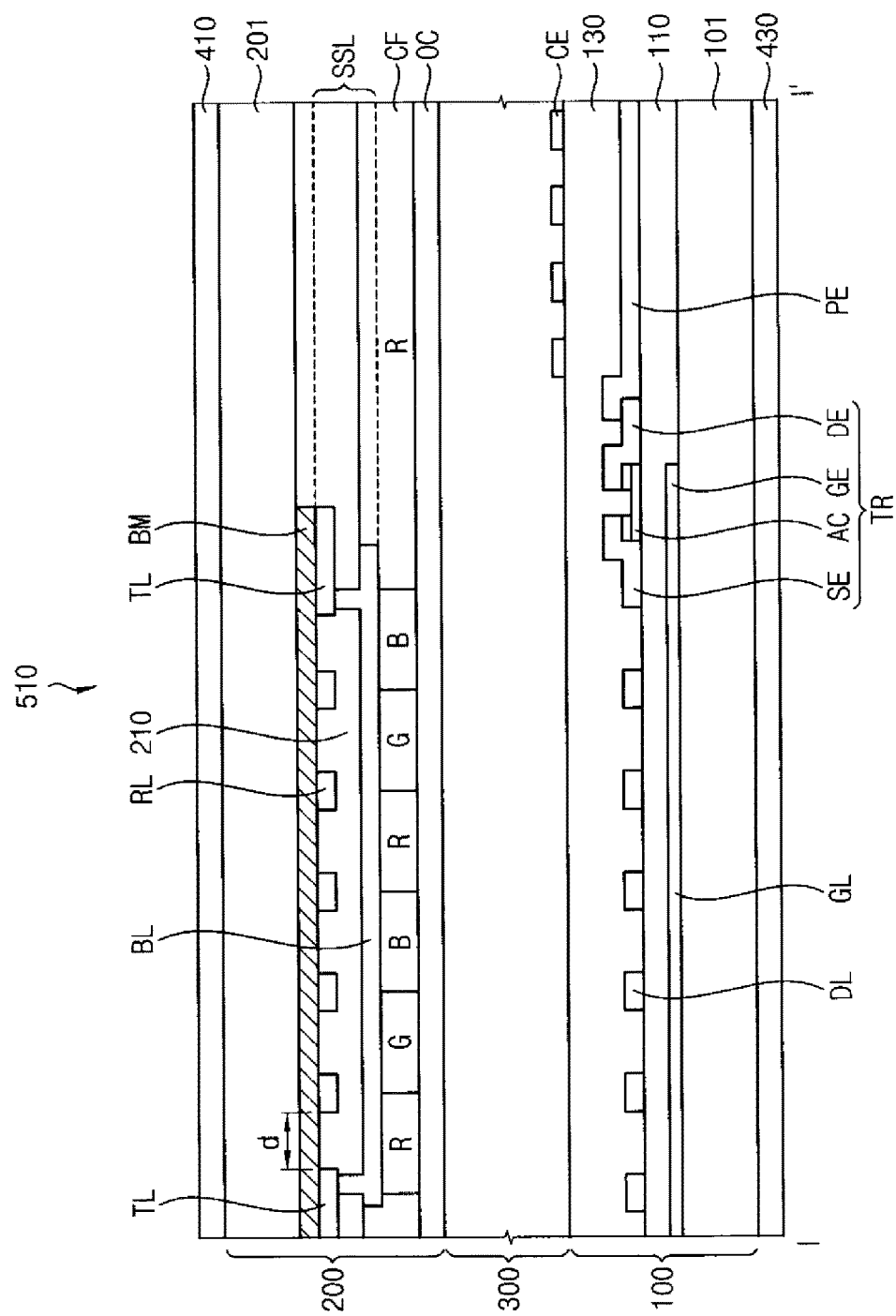

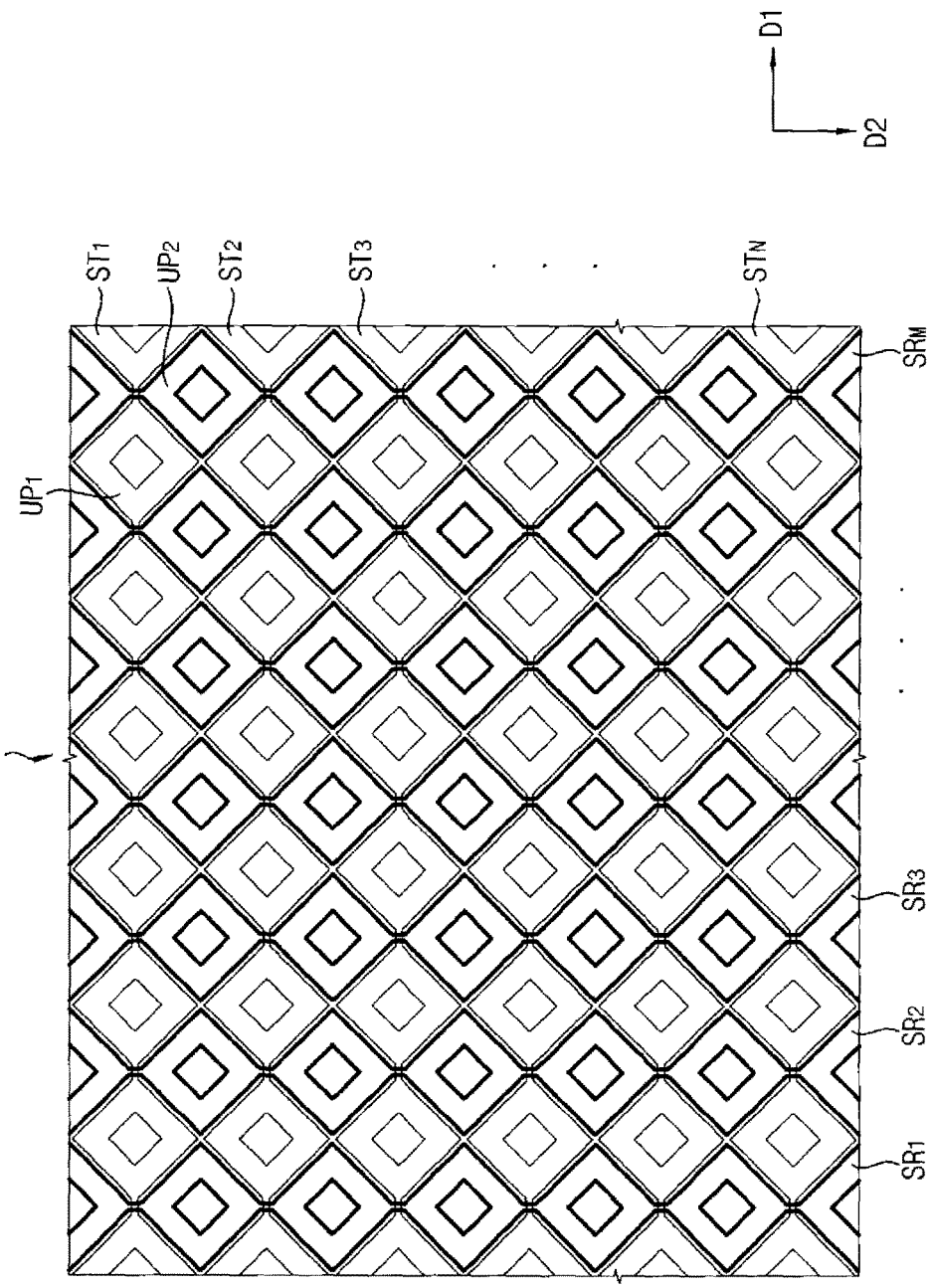

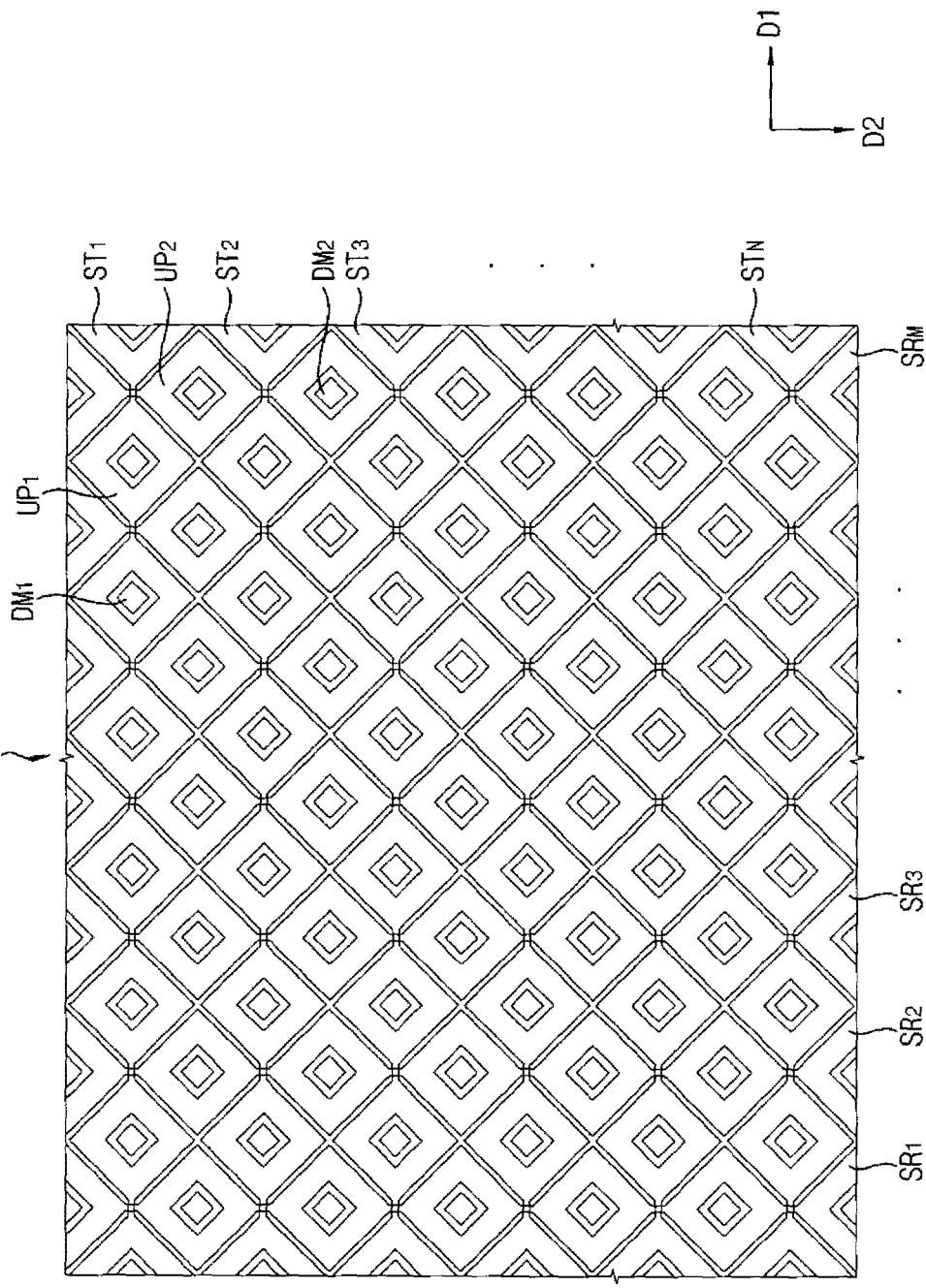

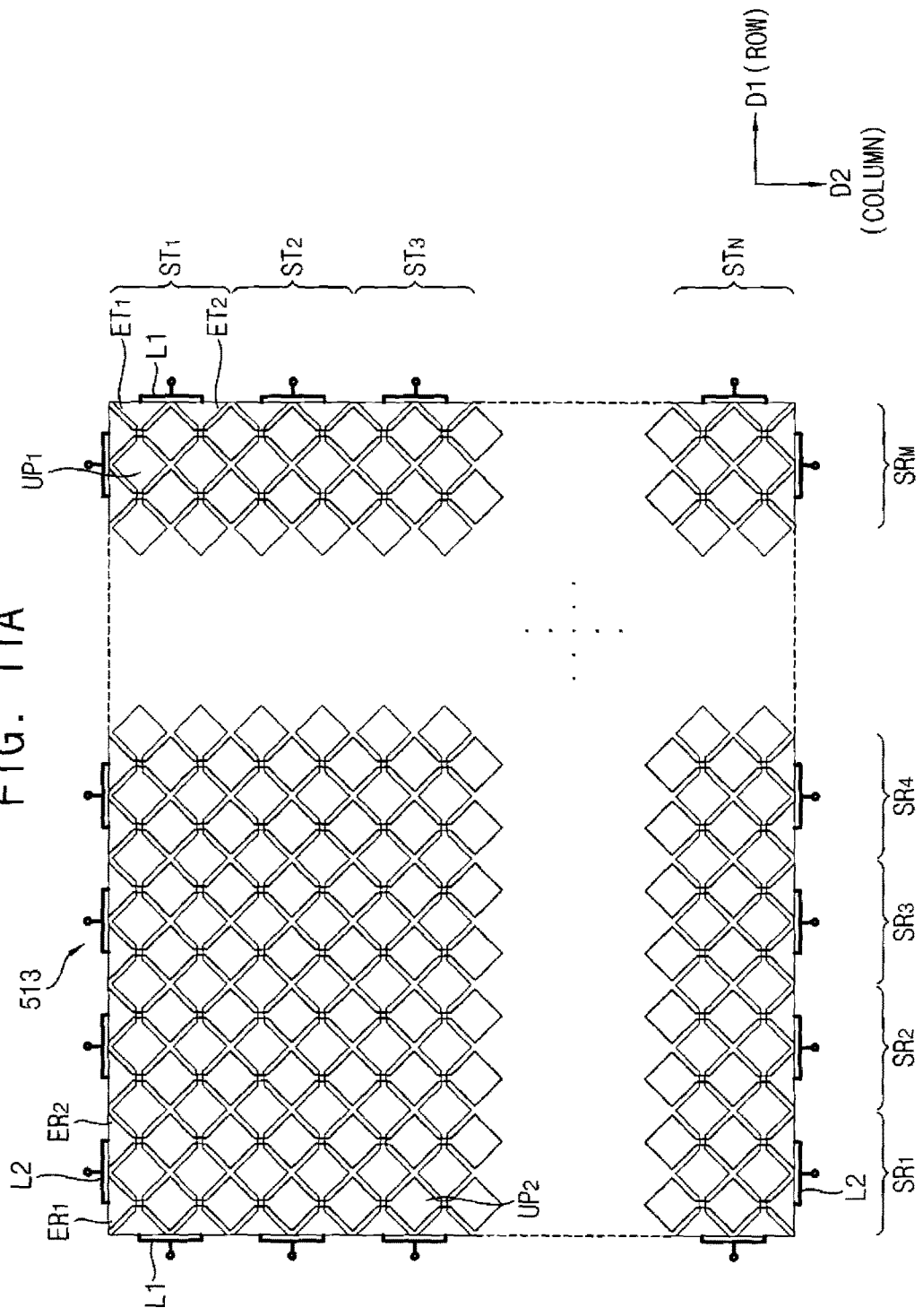

US 9,933,871 B2

SENSOR SUBSTRATE AND SENSING DISPLAY PANEL HAVING THE SAME

CROSS-REFERENCE TO RELATED APPLICATIONS

This application is a divisional of U.S. patent application Ser. No. 13/705,703, filed on Dec. 5, 2012, and claims priority from and the benefit of Korean Patent Application No. 10-2012-0066942, filed on Jun. 21, 2012, each of which is incorporated by reference for all purposes as if set forth herein.

BACKGROUND

Field

Exemplary embodiments of the present disclosure relate to sensor substrates and sensing display panels incorporating the sensor substrate, and more particularly to sensor substrates and sensing display panels incorporating sensor substrates to prevent damage associated with static electricity.

Discussion

A liquid crystal display (LCD) apparatus typically relatively thin and light weight, as well as consumes low levels of power. As such, LCDs are generally used in association with monitors, laptop computers, cellular phones, personal digital assistants, and the like. Conventional LCDs include an LCD panel configured to display images via light transmittance through liquid crystal, the light radiating from a backlight assembly disposed "behind" or "under" the LCD panel and, thereby, providing the light to the LCD panel.

An LCD panel typically includes an array substrate having one or more signal lines, thin film transistors TFT, and pixel electrodes, as well as includes an opposite substrate facing the array substrate and having a common electrode. A liquid crystal layer is generally speaking disposed between the array substrate and the opposite substrate. The liquid crystal layer may be driven using a vertical electric field which may be formed by a potential difference between the common electrode and the one or more pixel electrodes. In terms of performance, liquid crystal layers driven via vertical electric fields typically yield more than sufficient levels of light transmittance and exhibit high aperture ratios. These liquid crystal layers, however, can be deficient with respect to viewing angles.

Conventional approaches to improving the viewing angle typically entails disposing the common electrode and the one or more pixel electrodes on an array substrate so that the liquid crystal layer may be driven via a horizontal electric field, which is formed via a potential difference between the common electrode and the one or more pixel electrodes. It is noted, however, that LCD panels utilizing horizontal electric fields including an opposing substrate opposite to the array substrate and not including a common electrode can be prone to negative effects associated with static electricity, such as static electricity build-up and discharge.

The above information disclosed in this Background section is only for enhancement of understanding of the background of the invention and therefore it may contain information that does not form any part of the prior art nor what the prior art may suggest to a person of ordinary skill in the art.

BRIEF SUMMARY OF THE INVENTION

Exemplary embodiments provide a sensor substrate configured to prevent negative effects associated with static electricity, such as static electricity build-up and discharge.

Exemplary embodiments provide a sensing display panel incorporating a sensor substrate configured to prevent negative effects associated with static electricity, such as static electricity build-up and discharge.

Additional aspects will be set forth in the detailed description which follows and, in part, will be apparent from the disclosure, or may be learned by practice of the invention.

According to exemplary embodiments, a sensor substrate includes a base substrate, a black matrix pattern, a sensing electrode pattern, a driving electrode pattern, and at least one bridge line. The black matrix pattern is disposed on the base substrate and divides the base substrate into a light transmission area and a light blocking area. The sensing electrode pattern includes a plurality of first unit patterns arranged in association with a first direction. The driving electrode pattern includes a plurality of second unit patterns arranged in association with a second direction and are disposed adjacent to the plurality of first unit patterns. The at least one bridge line is connected between at least two of the plurality of first unit patterns or between at least two of the plurality of second unit patterns.

According to exemplary embodiments a sensing display panel includes: a display substrate and a sensor substrate. The s display substrate includes: a plurality of pixel electrodes, and a common electrode overlapping the pixel electrodes. The sensor substrate includes: a sensing electrode pattern, a driving electrode pattern, and at least one bridge line. The sensing electrode pattern includes a plurality of first unit patterns arranged in association with a first direction. The driving electrode pattern includes a plurality of second unit patterns arranged in association with a second direction and are disposed adjacent to the plurality of first unit patterns. The at least one bridge line is connected between at least two of the plurality of first unit patterns or between at least two of the plurality of second unit patterns.

According to exemplary embodiments, a sensing display panel includes: a display substrate and a sensor substrate. The display substrate includes: a plurality of pixel electrodes arranged in a matrix formation, a driving electrode pattern overlapping the plurality of pixel electrodes, and a common line connected to the driving electrode pattern. The sensor substrate includes a black matrix pattern including an area in which the plurality of pixel electrodes is disposed, the area corresponding to a light transmission area, and a sensing electrode pattern including a plurality of lines connected to one another and overlapping the black matrix pattern.

According to exemplary embodiments, a sensing display panel includes a display substrate and a sensor substrate. The display substrate includes a plurality of pixels, a driving electrode pattern, a common electrode pattern, and a common line. The plurality of pixel electrodes is disposed in a matrix formation comprising a row direction and a column direction. The driving electrode pattern includes a unit pattern arranged in the row direction and overlaps the plurality of pixel electrodes. The common electrode pattern is spaced apart from the unit pattern and overlaps the plurality of pixel electrodes, the common electrode pattern being arranged in the column direction. The common line extends in the row direction. The sensor substrate comprises a black matrix pattern and a sensing electrode pattern. The black matrix pattern comprises an area in which the plurality of pixel electrodes is disposed, the area corresponding to a light transmission area. The sensing electrode pattern comprises a plurality of lines connected to one another and overlapping the black matrix pattern.

According to exemplary embodiments, the sensor substrate includes at least one of the driving electrode pattern and the sensing electrode pattern, each of which may be formed including a metal material so that a display apparatus incorporating the sensor substrate may be protected from the deleterious effects associated with static electricity. Further, a bias signal, such as a direct current voltage exhibiting a predetermined voltage level or ground voltage GND is caused to be applied to at least one of the driving electrode pattern and the sensing electrode pattern so that a static electricity blocking effect may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 2 is an enlarged plan view of portion "A" of the sensing display panel of FIG. 1, according to exemplary embodiments.

FIG. 3 is a cross-sectional view of the sensing display panel of FIG. 2 taken along sectional line l-I', according to exemplary embodiments.

FIG. 9 is a plan view of a display apparatus incorporating a sensing display panel, according to exemplary embodiments.

FIG. 10 is a plan view of a display apparatus incorporating a sensing display panel, according to exemplary embodiments.

FIG. 11A is a plan view of a sensing display panel, according to exemplary embodiments.

DETAILED DESCRIPTION

Figure 1:
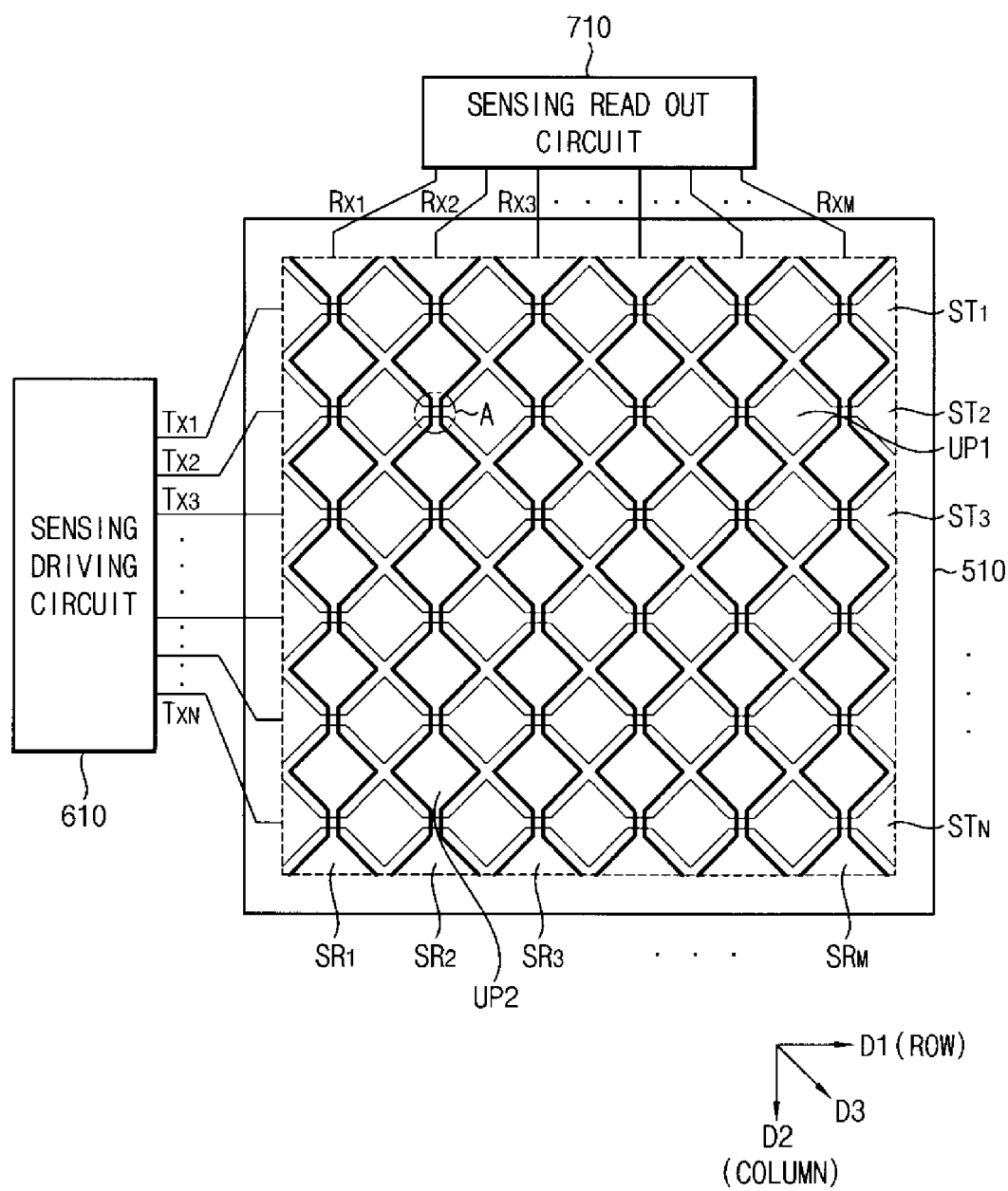
FIG. 1 is a block diagram of a display apparatus incorporating a sensing display panel, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers and/or regions may be exaggerated for clarity and descriptive purposes. Also, like reference numerals denote like elements.

When an element or layer is referred to as being "on," "connected to," or "coupled to" another element or layer, it may be directly on, directly connected to, or directly coupled to the other element or layer, or intervening elements or layers may be present. When, however, an element is referred to as being "directly on," "directly connected to," or "directly coupled to" another element or layer, there are no intervening elements or layers present. For the purposes of this disclosure, "at least one of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section that is discussed below may be termed a second element, component, region, layer, or section without departing from the teachings of the present invention.

Spatially relative terms, such as "beneath," "below," "lower," "above," "upper," and/or the like, may be used herein for descriptive purposes and, thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations) and, as such, the spatially relative descriptors used herein are to be interpreted accordingly.

The terminology used herein is for the purpose of describing particular embodiments only and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments may be described herein with reference to sectional and/or other forms of illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For instance, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to liquid crystal displays (LCD), it is contemplated that various exemplary embodiments are also applicable to other display technologies, such as various other self-emissive and/or non-self-emissive display technologies, e.g., light emitting diode (LED) displays, organic light emitting diode displays (OLED), plasma displays (PD), electrophoretic displays (EPD), electrowetting displays (EWD), etc.

FIG. 1 is a block diagram of a display apparatus incorporating a sensing display panel, according to exemplary embodiments. FIG. 2 is an enlarged plan view of portion "A" of the sensing display panel of FIG. 1.

As seen in FIGS. 1 and 2, the display apparatus includes a sensing display panel 510, a sensing driving circuit 610 and a sensing read out circuit 710. While specific reference will be made to this particular implementation, it is also contemplated that the display apparatus may embody many forms and include multiple and/or alternative components or features. For example, it is contemplated that the components of the display apparatus may be combined, located in separate structures, and/or separate locations.

According to exemplary embodiments, the sensing display panel 510 includes a plurality of driving electrode patterns ST1, ST2, ST3, . . . , STN, a plurality of sensing electrode patterns SR1, SR2, SR3, . . . , SRM, and a plurality of bridge lines BL, where 'n' and 'm' are natural, real numbers. In one exemplary implementation, the sensing display panel 510 may define a capacitive touch screen; however, it is contemplated that sensing display panel 510 may define or otherwise include any other suitable sensing display panel.

The driving electrode patterns ST1, ST2, ST3, . . . , STN may be extended in association with a first direction, e.g., D1, and may be arranged in association with a second direction, e.g., D2 crossing the first direction D1. The first direction D1 may be, for example, a row direction, whereas the second direction D2 may be, for instance, a column direction. Each of the driving electrode patterns ST1, ST2, ST3, . . . , STN includes (or otherwise defines) at least one first unit pattern UP1, such as a diamond shape. It is contemplated, however, that any suitable pattern (or pattern of shapes) may be utilized in association with first unit pattern UP1. As shown, the first unit pattern UP1 includes a plurality of driving lines TL, which are connected to each other, such as via a mesh shape. Again, it is contemplated that any suitable pattern (or pattern of shapes) may be utilized in association with the corresponding connections between driving lines TL. The driving lines TL overlap with a black matrix pattern BM. The black matrix pattern BM may define a transmission area corresponding to a pixel area PA of the sensing display panel 510. For instance, black matrix pattern BM may bound respective display regions of corresponding pixels of sensing display panel 510.

According to exemplary embodiments, the sensing electrode patterns SR1, SR2, SR3, . . . , SRM may be extended in association with the second direction D2 and may be arranged in association with the first direction D1. Each of the sensing electrode patterns SR1, SR2, SR3, . . . , SRM includes at least one second unit pattern UP2, such as the diamond shape. As with first unit pattern UP1, it is contemplated, that any suitable pattern (or pattern of shapes) may be utilized in association with second unit pattern UP2. To this end, it is noted that second unit pattern UP2 may or may not correspond to first unit pattern UP1. For instance, first unit pattern UP1 may relate to a pattern of diamond shapes, whereas second unit pattern UP2 may relate to a pattern of hexagonal shapes. As shown, however, first unit pattern UP1 and second unit pattern UP2 both correspond to diamond patterns. The second unit pattern UP2 may be disposed in an area defined by the first unit pattern UP1 and may be arranged alternately with the first unit pattern UP1 along a third direction, e.g., D3, respectively crossing the first direction D1 and the second direction D2. The second unit pattern UP2 includes a plurality of sensing lines RL, which may be connected to each other, such as via the mesh shape. Again, it is contemplated that any suitable pattern (or pattern of shapes) may be utilized in association with the corresponding connections between sensing lines RL. Further, the shape associated with the connections related to sensing lines RL may or may not corresponding to the shape associated with the connections related to driving lines TL. The sensing lines RL may, in exemplary embodiments, overlap with the black matrix pattern BM, which may be configured to define the pixel area PA of the display apparatus.

As previously mentioned, the driving electrode patterns ST1, ST2, ST3, . . . , STN and the sensing electrode pattern SR1, SR2, SR3, . . . , SRM may include a plurality of unit patterns, such as the diamond shape, but are not limited thereto. For example, the unit patterns may include various shapes, such as triangular shapes, square shapes, rectangular shapes, pentagonal shapes, hexagonal shapes, etc., as well as combinations thereof.

In exemplary embodiments, the bridge lines BL may be disposed in an area (or region) in which the sensing lines RL and the driving lines TL cross one another. To this end, the bridge lines BL may be electrically connected to the driving lines TL, which are spaced apart from each other via the sensing lines RL. In one exemplary embodiment, the bridge lines BL are connected to the driving lines TL, but exemplary embodiments are not limited thereto. For example, the bridge lines BL may be connected to the sensing lines RL, may be connected to both the driving lines TL and the sensing lines RL, etc.

Sensing driving circuit 610 may be configured to sequentially transfer a plurality of driving signals Tx1, Tx2, Tx3, . . . , TxN to the driving electrode patterns ST1, ST2, ST3, . . . , STN to drive the driving electrode patterns ST1, ST2, ST3, . . . , STN.

The sensing read out circuit 710 may be configured to receive sensing signals Rx1, Rx2, Rx3, . . . , RxM corresponding to, for example, an object that touches (or otherwise comes into contact with) a surface of the sensing display panel 510 based on the driving signals through the sensing electrode patterns SR1, SR2, SR3, . . . , SRM. According to exemplary embodiments, it is also contemplated that "near" touches (or contacts), e.g., when the object just about touches the surface but does not quite touch the surface, may also be detected based on detected variances of the driving signals through the sensing electrode patterns SR1, SR2, SR3, . . . , SRM.

According to various exemplary embodiments, sensing driving circuit 610 and/or the sensing read out circuit 710 may be implemented via software, hardware, firmware, or a combination thereof. For instance, sensing driving circuit 610 and/or the sensing read out circuit 710 may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the sensing display panel 510 may be protected by the driving electrode patterns ST1, ST2, ST3, . . . , STN and the sensing electrode patterns SR1, SR2, SR3, . . . , SRM, which may be formed from corresponding metal materials. For example, the sensing display panel 510 may be protected by the driving electrode patterns ST1, ST2, ST3, . . . , STN and the sensing electrode patterns SR1, SR2, SR3, . . . , SRM from static electricity, e.g., static electricity build-up, static electricity discharge, etc. In this manner, the sensing display panel 510 may be configured without a static electricity blocking layer conventionally utilized to block the deleterious effects associated with static electricity, such as one or more of those aforementioned effects.

In exemplary embodiments, at least one of the sensing driving circuit 610 and the sensing read out circuit 710 is configured to output a bias signal exhibiting a predetermined voltage level when the sensing display panel 510 is being driven. To this end, the bias signal exhibiting the predetermined voltage level may be applied to the driving electrode patterns ST1, ST2, ST3, . . . , STN or the sensing electrode patterns SR1, SR2, SR3, . . . , SRM when the sensing display panel 510 is being driven. The bias signal may be a ground voltage or a direct current (DC) voltage exhibiting a predetermined voltage level. As such, a static electricity blocking effect may be improved.

FIG. 3 is a cross-sectional view of the sensing display panel of FIG. 2 taken along sectional line I-I', according to exemplary embodiments.

With continued reference to FIG. 2, the sensing display panel 510 includes a display substrate 100, a sensor substrate 200 opposite the display substrate 100, and a liquid crystal layer 300 disposed between the display substrate 100 and the sensor substrate 200. In addition, the sensing display panel 510 may further include a first polarizing plate 410 disposed on the sensor substrate 200 and a second polarizing plate 430 disposed on (e.g., under) the display substrate 100.

Display substrate 100 includes a first base substrate 101, a gate line GL, a gate insulating layer 110, a data line DL, a switching element TR, a pixel electrode PE, a protecting layer 130, and a common electrode CE.

Gate line GL is disposed on the first base substrate 101, and may be extended in the first direction D1, as well as arranged in the second direction D2. For example, the gate line GL may overlap the black matrix pattern BM, which may also be extended in the first direction D1. To this end, the gate line GL may be electrically connected to a gate electrode GE of the switching element TR.

Gate insulating layer 110 may be disposed on the first base substrate 101 and, thereby, configured to cover the gate line GL and the gate electrode GE.

Data line DL may be disposed on the gate insulating layer 110 and extended in the second direction D2, as well as arranged in the first direction D1. For example, the data line DL may overlap with the black matrix pattern BM, which may also be extended in the second direction D2. The data line DL may be electrically connected to a source electrode SE of the switching element TR.

According to exemplary embodiments, the switching element TR may include an active layer AC that is disposed between the gate electrode GE and the source electrode SE and drain electrode DE. The active layer AC includes, for example, a semiconductive layer manufactured from, for instance, amorphous silicon (a-Si:H) and an ohmic contact layer exhibiting n+ amorphous silicon (n+ a-Si:H). In addition, the active layer may include an oxide semiconductive layer. The oxide semiconductive layer may include the amorphous oxide exhibiting at least one of indium (In), zinc (Zn), gallium (Ga), tin (Sn), or hafnium (HF). For example, the oxide semiconductive layer may include an amorphous oxide exhibiting indium (In), zinc (Zn), and gallium (Ga), or an amorphous oxide exhibiting indium (In), zinc (Zn), and hafnium (HF). The oxide semiconductive layer may include the oxide, such as, for instance, indium zinc oxide (InZnO), indium gallium oxide (InGaO), indium tin oxide (InSnO), tin zinc oxide (ZnSnO), tin gallium oxide (GaSnO), and tin gallium oxide (GaZnO). While certain materials and combinations of materials have been described in association with switching element TR, it is contemplated that any other suitable materials may be utilized.

Accordingly, pixel electrode PE may be disposed in the pixel area, which may be defined by the black matrix pattern BM. Pixel electrode PE may be electrically connected to the drain electrode DE and configured to receive a data voltage transferred via the data line DL.

Protecting layer 130 may be disposed on the first base substrate 101 and, thereby, configured to cover the data line DL, the source electrode SE, and the pixel electrode PE.

Common electrode CE may be disposed in at least one pixel area, as well as configured to overlap the pixel electrode PE. The common electrode CE may be a slit patterned electrode; however, any other suitable common electrodes may be utilized in association with exemplary embodiments described herein. Common electrode CE may be electrically connected to a common line (not shown) and, thereby, configured to receive a common voltage Vcom via the common line.

According to exemplary embodiments, the sensor substrate 200 includes a second base substrate 201, a black matrix pattern BM, a sensor layer SSL, a color filter layer CF, and an overcoating layer OC.

Black matrix pattern BM may be disposed on the second base substrate 201, and may be configured to define a transmission area corresponding to the pixel area PA of the sensing display panel 510. The black matrix pattern BM may exhibit a matrix shape, such that the pixel area PA corresponding to the transmission area may be arranged in association with the matrix shape of the black matrix BM.

As described in association with FIGS. 1 and 2, the sensor layer SSL includes a plurality of driving electrode patterns ST1, ST2, ST3, ..., STN, a plurality of sensing electrode patterns SR1, SR2, SR3, ..., SRM, a bridge line BL, and an insulating layer 210.

Driving electrode patterns ST1, ST2, ST3, ..., STN may be extended in the first direction D1 and may be arranged in the second direction D2. Each of the driving electrode patterns ST1, ST2, ST3, ..., STN may include at least one first unit pattern UP1, such as the diamond shape. The first unit pattern UP1 includes a plurality of driving lines TL, which may be connected to each other via the mesh shape. The driving lines TL may be configured to overlap the black matrix pattern BM.

Sensing electrode patterns SR1, SR2, SR3, ..., SRM may be extended in the second direction D2 and may be arranged in the first direction D1. Each of the sensing electrode patterns SR1, SR2, SR3, ..., SRM may include at least one second unit pattern UP2, such as the diamond shape. The second unit pattern UP2 may be spaced apart from the first unit pattern UP1. The second unit pattern UP2 may include a plurality of sensing lines RL, which may be connected to each other, such as via the mesh shape. The sensing lines RL may be configured to overlap with the black matrix pattern BM.

Bridge line BL may be connected to the driving lines TL of the driving electrode patterns, which may be spaced apart from each other via the sensing electrode pattern comprising sensing lines RL.

A contact hole CH is configured to expose the driving lines TL of the driving electrode pattern. The contact hole CH may be formed in the insulating layer 210. The bridge line BL may be connected to the driving lines TL via the contact hole CH.

According to exemplary embodiments, sensing display panel 510 may be configured as a capacitive touch screen. In this manner, touches and/or "near" touches may be sensed via detection of a capacitive capacitance Cmutual arising between the driving electrode pattern including driving lines TL and the sensing electrode pattern including sensing lines RL, which may be changed (or otherwise altered) when a conductive object (such as a finger) touches or "near" touches the surface of sensing display panel 510. To this end, a touch position (or location) may also be detected based on the position (or location) of the altered sensed capacitive capacitance. Accordingly, in response to the capacitive capacitance Cmutual between the driving electrode pattern including driving lines TL and the sensing electrode pattern including sensing lines RL being increased, the capacitive touch screen may easily detect the touch or "near" touch associated with the altered capacitive capacitance Cmutual.

For example, the capacitive capacitance Cmutual may be increased, when a size of a fringe area disposed between the driving electrode pattern including driving lines TL and the sensing electrode pattern including sensing lines RL is increased and a separation distance between the driving electrode pattern including driving lines TL and the sensing electrode pattern including sensing lines is decreased.

Color filter layer CF may be disposed on (e.g., under) the sensor layer SSL, and may include a plurality of color filters, such as a red color filter R, a green color filter G, a blue color filter B, etc. While illustrated beneath sensor layer SSL, it is also contemplated that color filter layer CF may be disposed above sensor layer SSL, as will become more apparent below, such as, for example, in association with the description corresponding to FIGS. 5A-5E. Further, it is contemplated that color filter layer CF may be disposed more or less in-line with sensor layer SSL, as will also become more apparent below, such as, for instance, described in association with FIGS. 6A-6E.

Overcoating layer OC may be disposed on (e.g., under) the color filter layer CF. In this manner, overcoating layer OC may be utilized to level out, e.g., ensure a flat (or substantially flat) surface of, the sensor substrate 200.

According to exemplary embodiments, the driving electrode patterns ST1, ST2, ST3, ..., STN and the sensing electrode patterns SR1, SR2, SR3, ..., SRM formed with suitable metal material may be disposed in the sensor substrate 200 adjacent to an outside surface so that the sensing display panel 510 may be protected from the deleterious effects associated with static electricity, e.g., static electricity build-up, static electricity discharge, etc. In this manner, the sensing display panel 510 may be configured without a conventional static electricity blocking layer typically formed to block such effects associated with static electricity.

FIGS. 4A-4E are cross-sectional views of the sensor substrate of FIG. 3 taken along sectional line II-II' at various stages of one or more manufacturing processes, according to exemplary embodiments. To this end, it is noted that the description of FIGS. 4A-4E will be facilitated via the proffered description of FIG. 3 and, therefore, the proceeding description of FIGS. 4A-4E may include continued references to one or more components and/or features described in association with FIG. 3.

Figure 4A:
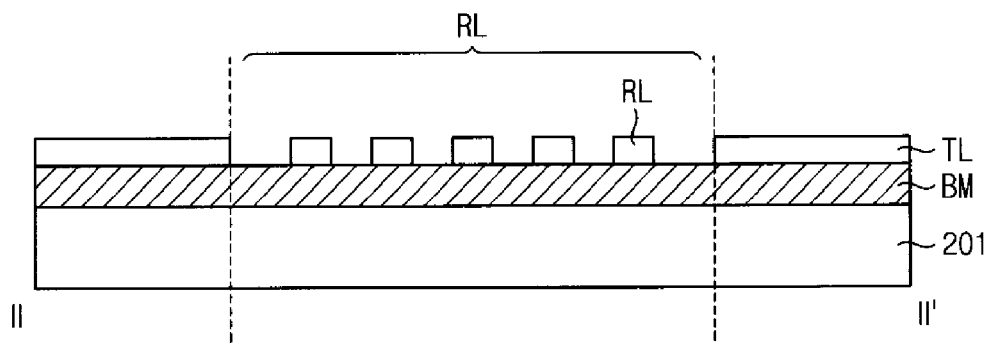
FIGS. 4A-4E are cross-sectional views of a sensor substrate taken along sectional line II-II' at various stages of one or more manufacturing processes, according to exemplary embodiments.

Adverting to FIG. 4A, a blocking layer is disposed on the second base substrate 201. The blocking layer is patterned to yield the black matrix pattern BM via one or more first masks and first patterning processes.

A first metal layer is disposed on the second base substrate 201 including the black matrix pattern BM. The first metal layer is patterned via one or more second masks and second patterning processes. In this manner, the first metal layer may be patterned to form the driving electrode patterns ST1, ST2, ST3, ..., STN and the sensing electrode patterns SR1, SR2, SR3, ..., SRM. The driving electrode patterns ST1, ST2, ST3, ..., STN include a plurality of driving lines TL and the sensing electrode patterns SR1, SR2, SR3, ..., SRM include a plurality of sensing lines RL. The driving lines TL and the sensing lines RL may be configured to overlap the black matrix pattern BM.

Figure 4B:
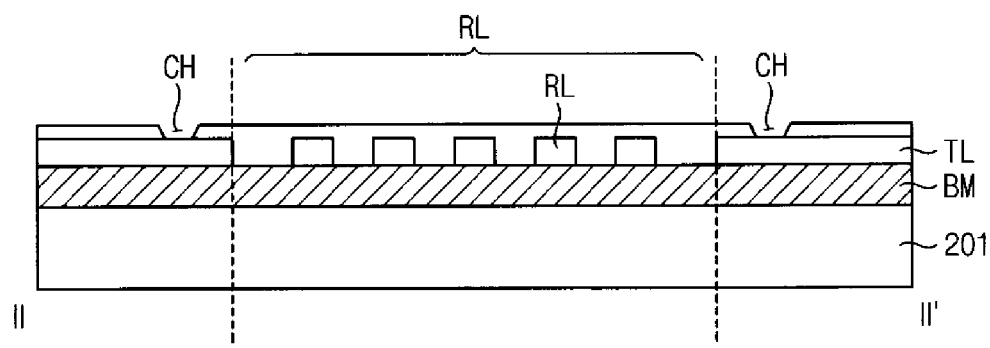

Adverting to FIG. 4B, an insulating layer 210 is disposed on the second base substrate 201 including the driving lines TL and the sensing lines RL. The insulating layer 210 may be patterned via one or more third masks and third patterning processes to form the contact hole CH, which may be configured to expose at least a portion of the driving lines TL. The insulating layer 210 may include silicon nitride (SiNx), silicon oxide (SiOx), and/or any other suitable material, composite, etc. To this end, the insulating layer 210 may be formed via, for example, one or more plasma enhanced chemical vapor deposition (PECVD) techniques. It is contemplated, however, that any other suitable depository, epitaxial, growth, sputtering, etc., techniques may be utilized. In addition, the insulating layer 210 may include a plurality of layers, e.g., a double layer, formed via one or more similar or different manufacturing processes, as well as exhibit similar or different materials from one another.

Figure 4C:
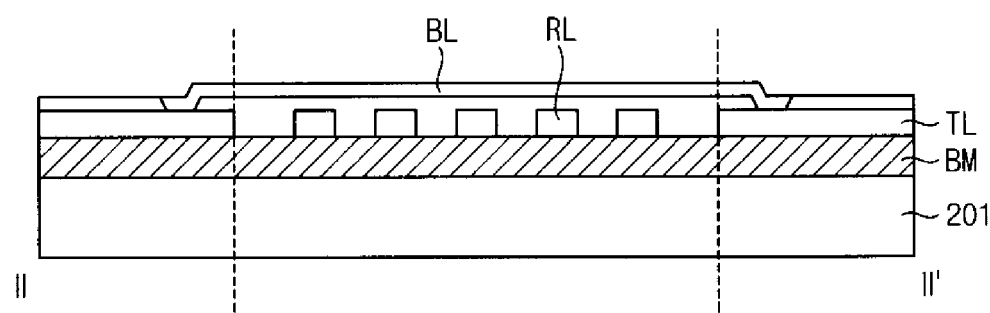

With reference to FIG. 4C, a second metal layer is disposed on the first metal layer, which includes the contact hole CH formed therein. The second metal layer may be patterned via one or more fourth masks and fourth manufacturing processes to form the bridge line BL. The bridge line BL may be connected to the driving lines TL via the contact hole CH.

Figure 4D:
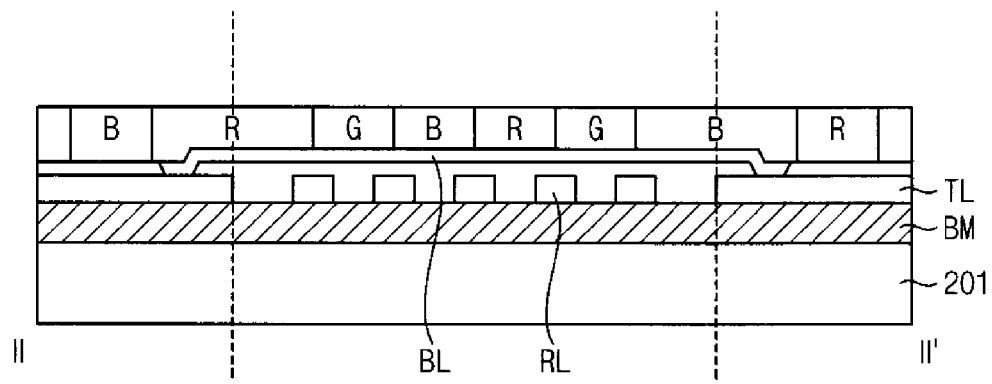

As seen in FIG. 4D, a plurality of color filters R, G and B may be sequentially disposed on the second base substrate 201 including the second metal layer from which the bridge line BL is patterned.

Figure 4E:
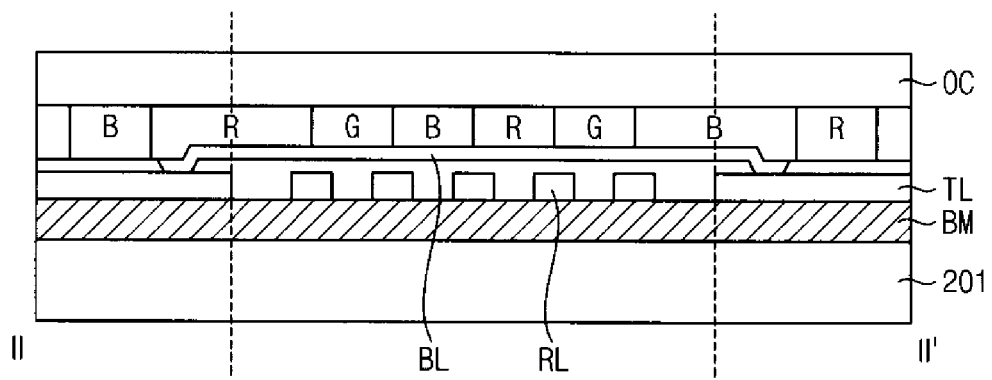

Adverting to FIG. 4E, an overcoating layer OC is disposed on the color filters R, G and B. In exemplary embodiments, overcoating layer OC may be planarized so that a surface of the sensor substrate 200 is flat or substantially flat.

According to exemplary embodiments, the aforementioned manufacturing processes may further include forming the above-noted electrode pattern, the contact hole of the insulating layer, and the bridge line using three (3) masks to form a color filter substrate of the LCD. In any event, the sensor substrate formed thereby may include the driving electrode pattern including driving lines TL and the sensing electrode pattern including the sensing lines RL, which may be configured to enable sensation of touches of and/or "near" touches to a surface of the sensor substrate, as well as configured to prevent the deleterious effects associated with static electricity.

FIGS. 5A-5E are cross-sectional views of a sensor substrate at various stages of a manufacturing process, according to exemplary embodiments. It is noted that the sensor substrate manufactured in association with the methodology described in connection with FIGS. 5A-5E is also illustrated in cross-sectional view based on sectional line II-II' of FIG. 2. To this end, it is also noted that the description of FIGS. 5A-5E will be facilitated via the proffered description of FIG. 2 and, therefore, the proceeding description of FIGS. 5A-5E may include continued references to one or more components and/or features described in association with FIG. 2.

According to exemplary embodiments, manufacturing of a sensor substrate may further include disposing a sensor layer after manufacturing of a color filter substrate.

Figure 5A:
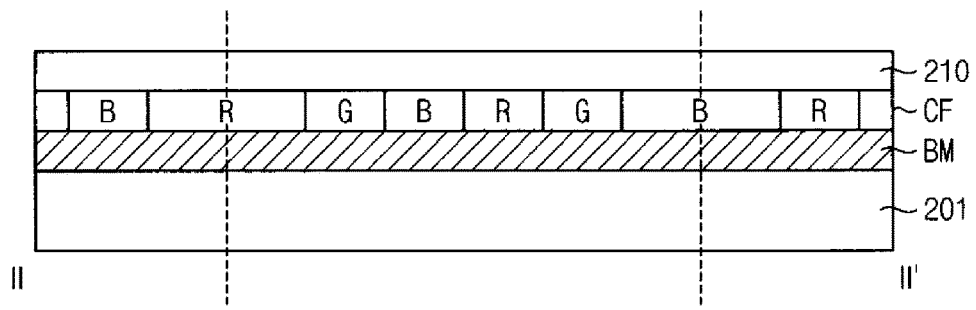
FIGS. 5A-5E are cross-sectional views of a sensor substrate at various stages of a manufacturing process, according to exemplary embodiments.

For example, as seen in FIG. 5A, the black matrix pattern BM is disposed on the second base substrate 201. The color filter layer CF is disposed on the black matrix pattern BM. A first insulating layer 210 (or overcoating layer OC) is disposed on the color filter layer CF. As described above, the color filter substrate included in the display may be generally manufactured utilizing any suitable manufacturing technique, such one or more of the aforementioned manufacturing techniques.

Figure 5B:
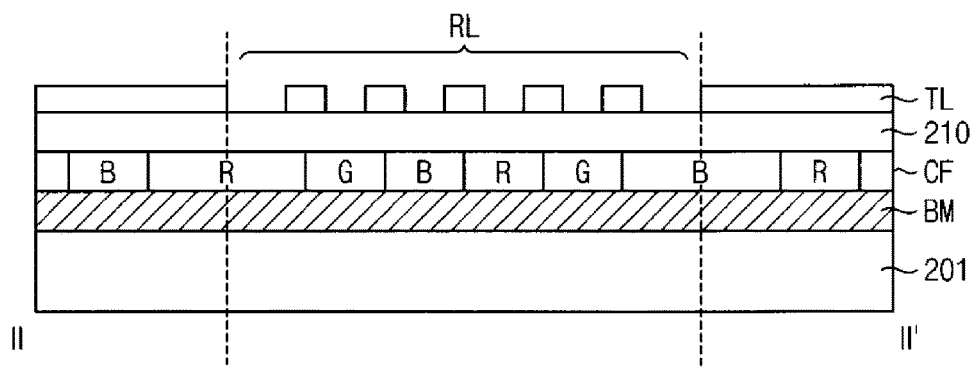

Adverting to FIG. 5B, the first metal layer is disposed on the second base substrate 201 including the insulating layer 210. The first metal layer may be patterned via one or more first masks and first patterning processes to form the driving electrode patterns ST1, ST2, ST3, ..., STN and the sensing electrode patterns SR1, SR2, SR3, ..., SRM. The driving electrode patterns ST1, ST2, ST3, ..., STN include a plurality of driving lines TL, and the sensing electrode patterns SR1, SR2, SR3, ..., SRM include a plurality of sensing lines RL. The driving lines TL and the sensing lines RL may be configured to overlap the black matrix pattern BM.

Figure 5C:
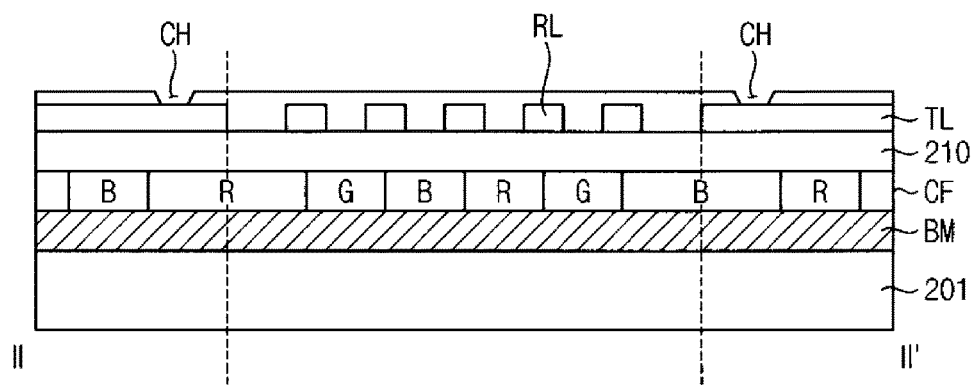

With reference to FIG. 5C, a second insulating layer 210 is disposed on the second base substrate 201 including the driving lines TL and the sensing lines RL. As such, the second insulating layer 210 may be patterned via one or more second masks and second patterning processes to form the contact hole CH, which may be configured to expose at least a portion of the driving lines TL. The second insulating layer 210 may include silicon nitride (SiNx), silicon oxide (SiOx), and/or any other suitable material, composite, etc. To this end, the second insulating layer 210 may be formed via, for example, one or more plasma enhanced chemical vapor deposition (PECVD) techniques. It is contemplated, however, that any other suitable depository, epitaxial, growth, sputtering, etc., techniques may be utilized. In addition, the second insulating layer 210 may include a plurality of layers, e.g., a double layer, formed via one or more similar or different manufacturing processes, as well as exhibit similar or different materials from one another.

Figure 5D:
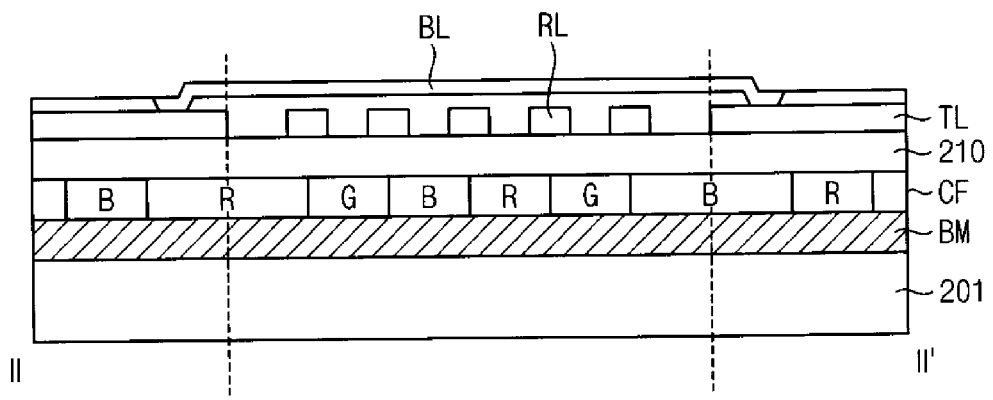

Adverting to FIG. 5D, the second metal layer is disposed on the second base substrate 201 including the second insulating layer 210 from which the contact hole CH is formed. The second metal layer may be patterned via one or more third masks and third patterning processes to form the bridge line BL. The bridge line BL may be connected to the driving lines TL via the contact hole CH.

Figure 5E:
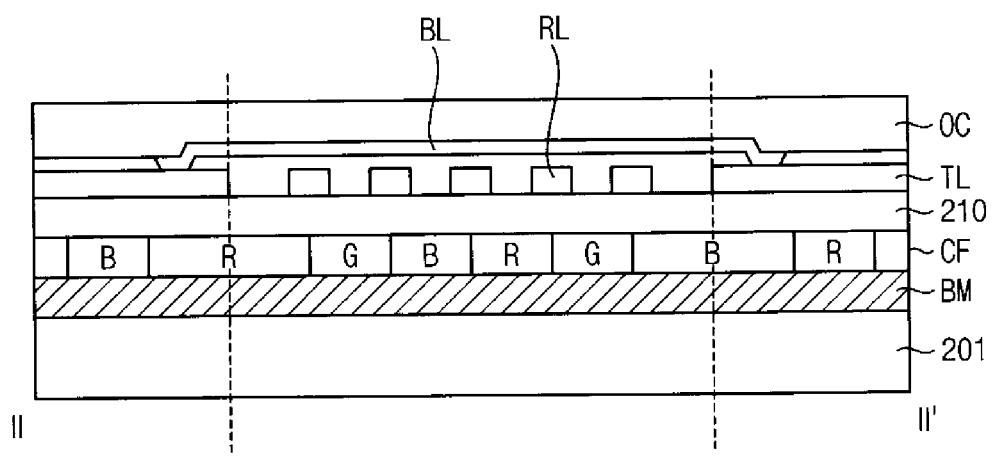

As seen in FIG. 5E, the overcoating layer OC is disposed on the second base substrate 201 including the bridge line BL. In exemplary embodiments, overcoating layer OC may be planarized so that a surface of the sensor substrate 200 is flat or substantially flat.

According to exemplary embodiments, the aforementioned manufacturing processes may further include forming the above-noted color filter substrate using four (4) additional masks. Again, the sensor substrate formed thereby may be configured to enable sensation of touches and/or "near" touches to a surface of the sensor substrate, as well as configured to prevent the deleterious effects associated with static electricity.

FIGS. 6A-6E are cross-sectional views of a sensor substrate at various stages of a manufacturing process, according to exemplary embodiments. It is noted that the sensor substrate manufactured in association with the methodology described in connection with FIGS. 6A-6E is also illustrated in cross-sectional view based on sectional line II-II' of FIG. 2. To this end, it is also noted that the description of FIGS. 6A-6E will be facilitated via the proffered description of FIG. 2 and, therefore, the proceeding description of FIGS. 6A-6E may include continued references to one or more components and/or features described in association with FIG. 2.

Figure 6A:
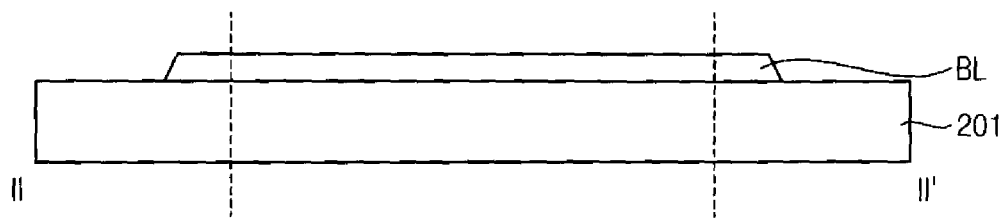
FIGS. 6A-6E are cross-sectional views a sensor substrate at various stages of a manufacturing process, according to exemplary embodiments.

As seen in FIG. 6A, the first metal layer is disposed on the second base substrate 201. The first metal layer may be patterned via one or more first masks and first patterning processes to form the bridge line BL.

Figure 6B:
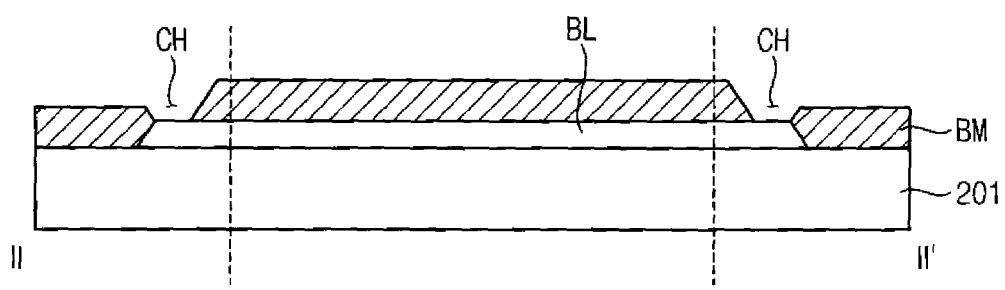

Adverting to FIG. 6B, the blocking layer is disposed on the second base substrate 201 including the bridge line BL. The blocking layer may be patterned via one or more second masks and patterning processes to form the black matrix pattern BM. According to exemplary embodiments, the contact hole CH is formed in the black matrix pattern BM and configured to expose at least a portion of the bridge line BL.

Figure 6C:
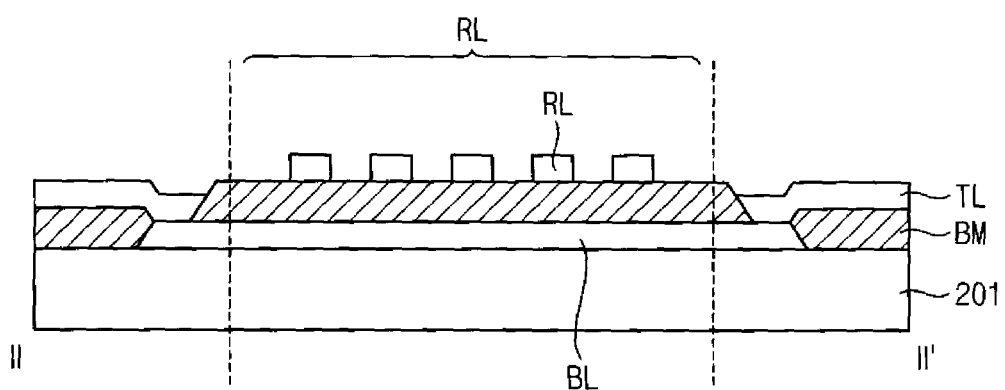

With reference to FIG. 6C, the second metal layer is disposed on the second base substrate 201 including the black matrix pattern BM, in which the contact hole CH is formed. The second metal layer may be patterned via one or more third masks and third patterning processes to form the driving electrode patterns ST1, ST2, ST3, . . . , STN and the sensing electrode patterns SR1, SR2, SR3, . . . , SRM. The driving electrode patterns ST1, ST2, 3, . . . , STN include a plurality of driving lines TL and the sensing electrode patterns SR1, SR2, SR3, . . . , SRM include a plurality of sensing lines RL. The driving lines TL and the sensing lines RL overlap the black matrix pattern BM.

Figure 6D:
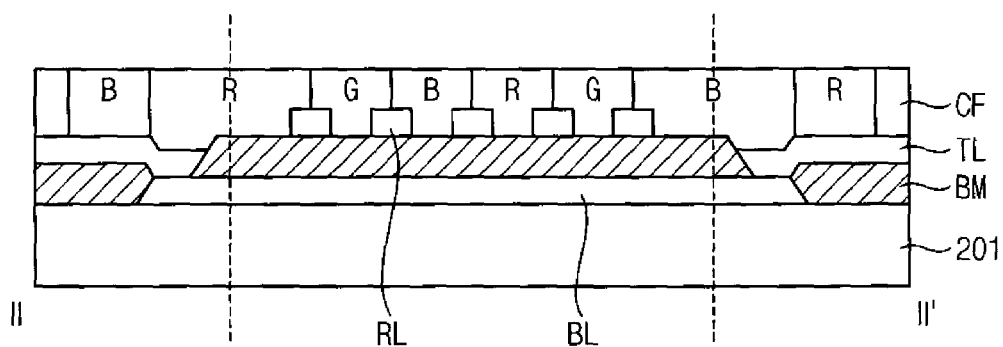

As seen in FIG. 6D, the color filters R, G and B are sequentially disposed on the base substrate 201 including the driving lines TL and the sensing lines RL.

Figure 6E:
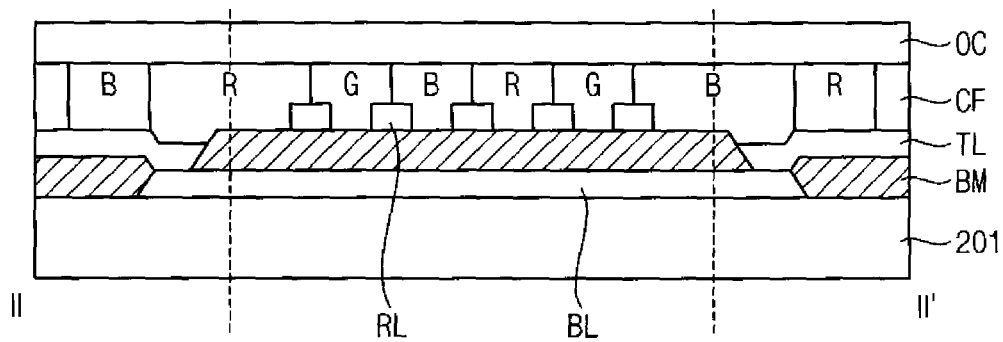

Adverting to FIG. 6E, the overcoating layer OC is disposed on the base substrate 201 including the color filters R, G, and B. In exemplary embodiments, overcoating layer OC may be planarized so that a surface of the sensor substrate 200 is flat or substantially flat.

As described in association with FIGS. 6A-6E, manufacturing of the sensor substrate may achieved via a smaller number of masks in comparison to the previous two exemplary manufacturing processes. In any event, however, the sensor substrate manufactured in association with the process of FIGS. 6A-6E may be configured to enable sensation of touches and/or "near" touches to a surface of the sensor substrate, as well as configured to prevent the deleterious effects associated with static electricity.

Figure 7:
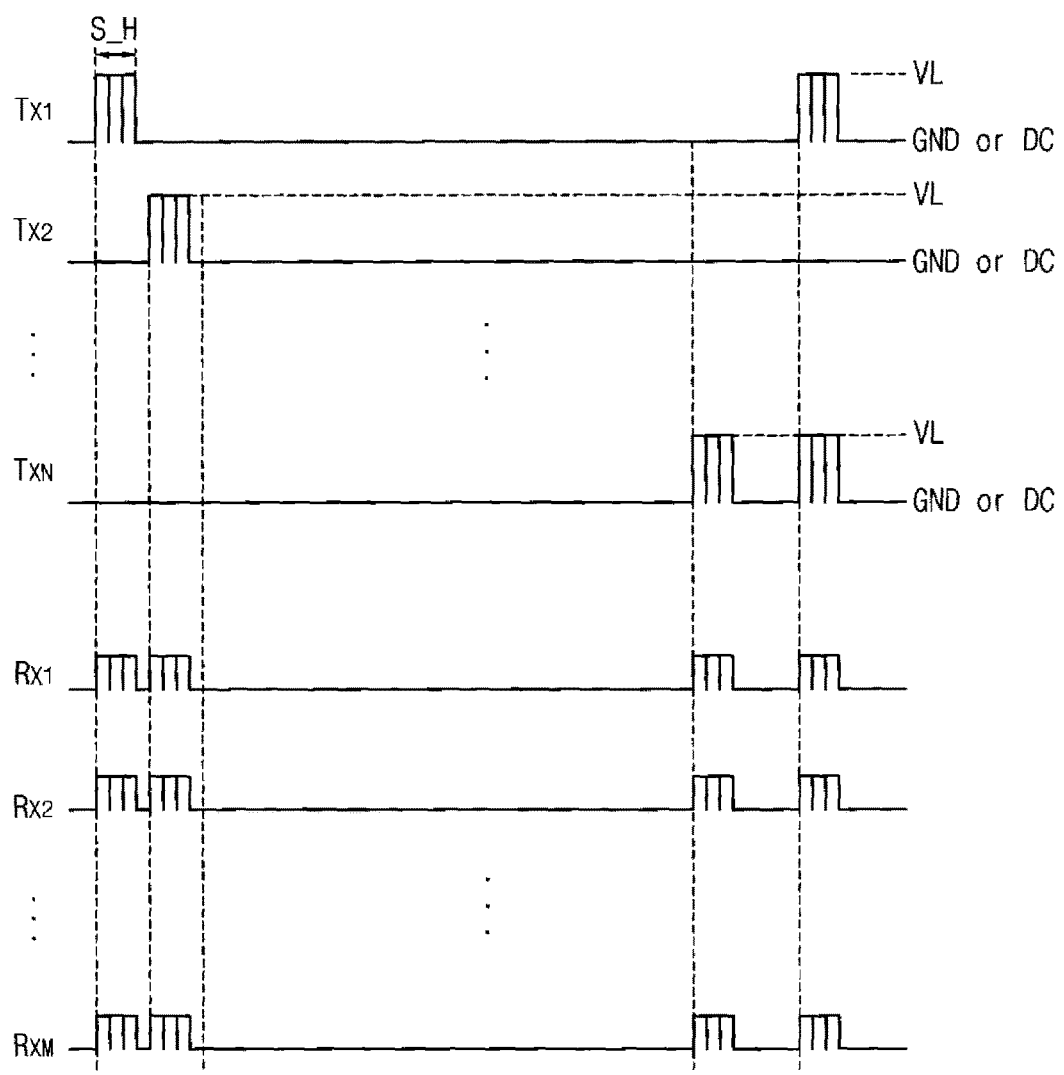
FIG. 7 is a waveform diagram associated with driving the sensing display panel of FIG. 1, according to exemplary embodiments.

FIG. 7 is a waveform diagram associated with driving the sensing display panel of FIG. 1, according to exemplary embodiments.

With reference to FIGS. 1 and 7, the sensing display panel 510 configured to improve a static electricity blocking effect may be driven in association with one or more of the waveforms seen in FIG. 7.

According to exemplary embodiments, the sensing driving circuit 610 may be configured to sequentially provide first to N-th driving electrode patterns ST1, ST2, ST3, . . . , STN with first to N-th driving signals Tx1, Tx2, Tx3, . . . , TxN. Each of the first to N-th driving signals Tx1, Tx2, Tx3, . . . , TxN include at least one pulse during a sensing horizontal period S_H.

For example, when a first driving signal Tx1 is applied to a first driving electrode pattern ST1, a bias signal (such as a ground voltage GND or a direct current (DC) voltage exhibiting a predetermined voltage level) may be applied to the remainder second to N-th driving electrode patterns ST2, ST3, . . . , STN, i.e., all of the driving electrode patterns except for the first driving electrode pattern ST1. As described above, when a second driving signal Tx2 is applied to a second driving electrode pattern ST2, a bias signal such as a ground voltage GND or a DC voltage exhibiting a predetermined voltage level may be applied to the remainder of the driving electrode patterns, such as the first driving electrode pattern ST1 and the third to N-th driving electrode patterns ST3, . . . , STN, i.e., all of the driving electrode patterns except for the second driving electrode pattern ST2.

The sensing read out circuit 710 may be configured to receive first to M-th sensing signals Rx1, Rx2, Rx3, . . . , RxM transited via the first to M-th sensing electrode patterns SR1, SR2, SR3, . . . , SRM.

While not shown, a sensing control part may be configured to detect a position of an object that has touched (or nearly touched) the surface of the sensing display panel 510 based on the output associated with the first to M-th sensing signals Rx1, Rx2, Rx3, . . . , RxM received by the sensing read out circuit 710.

Accordingly, while the sensing display panel 510 is being driven, the driving signal and the bias signal may be caused to be applied to the first to N-th driving electrode patterns ST1, ST2, ST3, . . . , STN so that a static electricity blocking effect may be improved.

Figure 8:
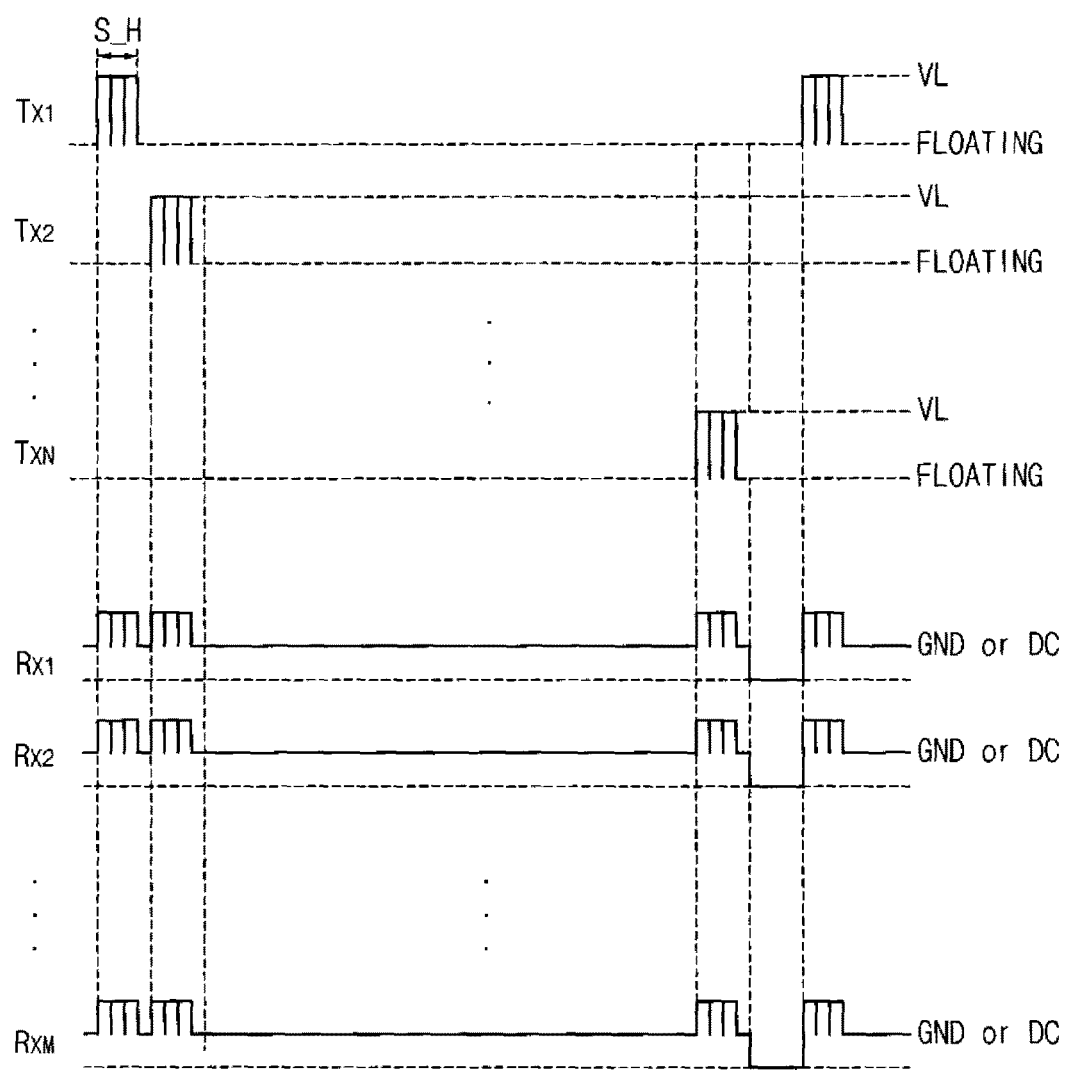
FIG. 8 is a waveform diagram associated with driving a sensing display panel, according to exemplary embodiments.

FIG. 8 is a waveform diagram associated with driving a sensing display panel, according to exemplary embodiments.

With reference to FIGS. 1 and 8, the sensing display panel 510 configured to improve a static electricity blocking effect may be driven in association with one or more of the waveforms seen in FIG. 8.

According to exemplary embodiments, the sensing driving circuit 610 may be configured to sequentially provide first to N-th driving electrode patterns ST1, ST2, ST3, . . . , STN with first to N-th driving signals Tx1, Tx2, Tx3, . . . , TxN. Each of the first to N-th driving signals Tx1, Tx2, Tx3, . . . , TxN include at least one pulse during a sensing horizontal period S_H.

For example, when a first driving signal Tx1 is applied to a first driving electrode pattern ST1, the sensing driving circuit 610 may be configured to block a voltage from being applied to the remainder of the driving electrode patterns, i.e., the second to N-th driving electrode patterns ST2, ST3, . . . , STN, i.e., all of the driving electrode patterns except for the first driving electrode pattern ST1. As such, the second to N-th driving electrode patterns ST2, ST3, . . . , STN may be electrically floated or otherwise isolated. As described above, when a second driving signal Tx2 is applied to a second driving electrode pattern ST2, the sensing driving circuit 610 may be further configured to block a voltage from being applied to the remainder of the driving electrode patterns, i.e., the first driving electrode pattern ST1 and third to N-th driving electrode patterns ST3, . . . , STN, i.e., all of the driving electrode patterns except for the second driving electrode pattern ST2. In this manner, the first driving electrode pattern ST1 and the third to N-th driving electrode patterns ST3, . . . , STN may be electrically floated or otherwise isolated.

According to exemplary embodiments, the sensing read out circuit 710 may be configured to provide the first to M-th sensing electrode patterns SR1, SR2, SR3, . . . , SRM with a bias signal, such as a ground voltage GND or a DC voltage exhibiting a predetermined voltage level, while the sensing display panel 510 is being driven. The sensing read out circuit 710 may be further configured to receive first to M-th sensing signals Rx1, Rx2, Rx3, . . . , RxM transited via the first to M-th sensing electrode patterns SR1, SR2, SR3, . . . , SRM.

As described above, while the sensing display panel 510 is being driven, the bias signal may be applied to the first to M-th sensing electrode patterns SR1, SR2, SR3, . . . , SRM and, as such, a static electricity blocking effect may be improved.

While not illustrated, a sensing control part may be provided to detect a position of an object touching or nearly touching a surface of the sensing display panel 510 based on the output of the first to M-th sensing signals Rx1, Rx2, Rx3, . . . , RxM received by the sensing read out circuit 710.

While also not depicted, the sensing display panel 510 may be driven by the sensing driving circuit 610 as shown in FIG. 7 and the sensing read out circuit 710 as shown in FIG. 8. For example, a remainder of the driving electrode patterns, except for the driving electrode pattern which receives the driving signal, may be configured to receive the bias signal, such as a ground voltage GND or a DC voltage exhibiting a predetermined voltage level, as shown in FIG. 7. In addition, while the sensing display panel 510 is being driven, the bias signal may be applied to the first to M-th sensing electrode patterns SR1, SR2, SR3, . . . , SRM, as shown in FIG. 8.

FIG. 9 is a plan view of a display apparatus incorporating a sensing display panel, according to exemplary embodiments. As previously noted, same reference numerals are used to refer to the same or like components as those previously described. As such, corresponding descriptions are not repeated, unless furtherance of exemplary embodiments would be facilitated by such duplicative description.

With reference to FIGS. 1, 2, and 9, the sensing display panel 511 is substantially similar to sensing display panel 510, except for the corresponding shapes of the driving electrode pattern and the sensing electrode pattern.

As seen in FIG. 9, each of the driving electrode patterns ST1, ST2, ST3, . . . , STN includes at least one first unit pattern UP1. The first unit pattern UP1 exhibits a diamond shape and may be divided into a first portion and a second portion surrounding the first portion. A plurality of driving lines TL, which are connected to one another, such as via in a mesh shape, is disposed in the second portion of the first unit pattern UP1. It is noted, however, that the driving lines TL are excluded from the first portion of the first unit pattern UP1. For example, the first portion of the first unit pattern UP1 may be configured similarly to diamond-shaped annulus, e.g., a diamond-shaped donut.

According to exemplary embodiments, each of the sensing electrode patterns SR1, SR2, SR3, . . . , SRM includes at least one second unit pattern UP2. The second unit pattern UP2 may also exhibit a diamond shape and may be divided into a first portion and a second portion surrounding the first portion. A plurality of sensing lines RL, which may be connected to one another, such as in a mesh shape, is disposed in the second portion of the second unit pattern UP2. It is noted, however, that the sensing lines RL may be excluded from the first portion of the second unit pattern UP2. For example, the first portion of the second unit pattern UP2 may be configured similarly to diamond-shaped annulus, e.g., a diamond-shaped donut.

According to one exemplary implementation, the sensing display panel 511 may be configured as a capacitive touch screen and, thereby, may be configured to exhibit a capacitive capacitance Cmutual established between the first and second unit patterns UP1 and UP2. To this end, a parasitic capacitance Cparasitic may be established between the unit patterns UP1 and UP2 and the common electrode CE. The performed of such a capacitive touch screen may be increased as the capacitive capacitance Cmutual is increased and the parasitic capacitance Cparasitic is decreased.

According to exemplary embodiments, the metal pattern, such as the driving and sensing lines TL and RL, is disposed in the second portion where a degree of contribution from the capacitive capacitance Cmutual is relatively large. Further, the metal pattern is excluded from the first portion, where a degree of contribution from the capacitive capacitance Cmutual is relatively small. As such, the parasitic capacitance Cparasitic of the sensing display panel 511 may be decreased and, thereby, performance increased.

In exemplary embodiments, the first unit pattern UP1 and the second unit pattern UP2 may include the first portion excluded from the metal pattern so that resistance-capacitance (RC) delay may be decreased. In comparison to the sensing display panel 510, a reliability of signals transferred via the driving electrode patterns ST1, ST2, ST3, . . . , STN and sensing electrode patterns SR1, SR2, SR3, . . . , SRM of sensing display panel 511 may be increased.

Further, the driving electrode patterns ST1, ST2, ST3, . . . , STN and the sensing electrode patterns SR1, SR2, SR3, . . . , SRM that are formed with the metal material may be disposed in the sensor substrate 200 adjacent to an outside of display panels 510 and 511 so that the sensing display panels 510 and 511 may be protected from static electricity, e.g., static electricity build-up and/or discharge. Accordingly, the sensing display panels 510 and 511 may be configured to omit conventional static electricity blocking layers typically utilized to block such effects associated with static electricity.

FIG. 10 is a plan view of a display apparatus incorporating a sensing display panel, according to exemplary embodiments. As previously noted, same reference numerals are used to refer to the same or like components as those previously described. As such, corresponding descriptions are not repeated, unless furtherance of exemplary embodiments would be facilitated by such duplicative description.

With reference to FIGS. 1, 2, and 10, the sensing display panel 512 is substantially similar to sensing display panels 510 and 511, except for the corresponding shapes of the driving electrode pattern and the sensing electrode pattern.

As seen in FIG. 10, each of the driving electrode patterns ST1, ST2, ST3, . . . , STN includes at least one first unit pattern UP1. The first unit pattern UP1 exhibits a diamond shape and may be divided into a first portion and a second portion surrounding the first portion and being spaced from the first portion. A plurality of driving lines TL that is connected to one another, such as in a mesh shape, is disposed in the second portion of the first unit pattern UP1. A first dummy pattern DM1 may be disposed in the first portion of the first unit pattern UP1. The first dummy pattern DM1 may include a plurality of driving lines TL connected to one another, such as in a mesh shape. The driving lines TL in the first portion may not be connected to the driving lines TL in the second portion. As such, the driving signal applied to the driving lines TL in the second portion may not be applied to the first dummy pattern DM1.

According to exemplary embodiments, each of the sensing electrode patterns SR1, SR2, SR3, . . . , SRM includes at least one second unit pattern UP2. The second unit pattern UP2 exhibits a diamond shape. The second unit pattern UP2 includes a first portion and a second portion surrounding the first portion and being spaced apart from the first portion. A plurality of sensing lines RL that are connected to one another, such as in a mesh shape, may be disposed in the second portion of the second unit pattern UP2. A second dummy pattern DM2 is disposed in the first portion of the second unit pattern UP2. The second dummy pattern DM2 may include a plurality of sensing lines RL which are connected to one another, such as in a mesh shape. The sensing lines RL in the first portion may not be connected to the sensing lines RL in the second portion. As such, a driving signal applied to the sensing lines RL in the second portion may not be applied to the second dummy pattern DM2.

In exemplary embodiments, the metal pattern, such as the driving lines TL and the sensing lines RL may be disposed in the second portion in which a degree of contribution of a capacitive capacitance Cmutual is relatively large. It is noted, however, that the metal pattern is electrically floated in the first portion in which a degree of contribution of the capacitive capacitance Cmutual is relative small. Accordingly, the parasitic capacitance Cparasitic of the sensing display panel 512 may be decreased.

To this end, the first unit patterns UP1 and the second unit patterns UP2 may be configured to include a dummy pattern electrically floated so that RC delay may be decreased. In comparison to the sensing display panel 510, a reliability of signals transited via the driving electrode patterns ST1, ST2, ST3, . . . , STN and the sensing electrode patterns SR1, SR2, SR3, . . . , SRM may be increased.

Additionally, the driving electrode patterns ST1, ST2, ST3, . . . , STN and the sensing electrode patterns SR1, SR2, SR3, . . . , SRM may include the first and second dummy patterns, which may be configured to include metal. As such, a static electricity blocking effect and a touch sensing sensitivity may be improved in comparison to the sensing display panel 511. In this manner, the sensing display panel 512 may also be configured without conventional static electricity blocking layers typically utilized to block effects associated with static electricity.

Figure 11B:
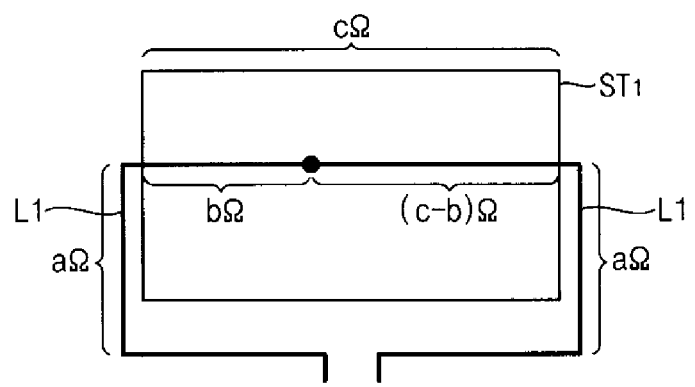
FIG. 11B is a schematic diagram of the sensing display panel of FIG. 11A, according to exemplary embodiments.

FIG. 11A is a plan view of a sensing display panel, according to exemplary embodiments. FIG. 11B is a schematic diagram of the sensing display panel of FIG. 11A.

Referring to FIG. 11A, the sensing display panel 513 may be substantially similar to the sensing display panels 510 and 511, except for the corresponding shapes of the driving electrode pattern and sensing electrode pattern.

According to exemplary embodiments, each of the driving electrode patterns ST1, ST2, ST3, . . . , STN includes a plurality of electrode rows ET1 and ET2. In this manner, each of the electrode rows ET1 and ET2, in turn, includes at least one first unit pattern UP1. The first unit pattern UP1 exhibits a diamond shape and includes a plurality of driving lines TL that are connected to one another, such as in a mesh shape. A size of the first unit pattern UP1, according to exemplary embodiments, may be smaller than that those previously described.

For example, when each of the driving electrode patterns ST1, ST2, ST3, . . . , STN includes K electrode rows ET1, . . . , ETK (where K is a natural, real number), the size of the first unit pattern UP1 may be smaller than $1/K^2$ times the size of the first unit pattern UP1 according to one or more of the previous described exemplary embodiments.

According to exemplary embodiments, each of the driving electrode patterns ST1, ST2, ST3, . . . , STN include a plurality of electrode rows ET1 and ET2 that are connected to one another. As seen in FIG. 11A, the electrode rows ET1 and ET2 are connected to one another via a first signal line L1, which is disposed on each of a plurality of peripheral areas oppositely disposed to one another. While not depicted, the first unit pattern UP1 included in the first electrode row ET1 may be connected to the first unit pattern UP1 included in the second electrode row ET2 adjacent to the first electrode row ET1 in the column direction, so that the electrode rows ET1 and ET2 are electrically connected to one another. In this manner, the first driving electrode pattern ST1 may be configured to receive the driving signal from the sensing driving circuit 610 via a dual mode via the first signal lines L1 connected to both ends of the first driving electrode pattern ST1.

Alternatively (or additionally), the signal line L1 may be connected to one end of the driving electrode pattern. To this end, the driving electrode pattern may be configured receive the driving signal from the sensing driving circuit 610 via a single mode via the signal line L1 connected to one end of the driving electrode pattern. For example, when the driving electrode pattern is an odd-numbered row, such as the first driving electrode pattern, a signal line L1 connected to a first end of the first driving electrode pattern may receive the driving signal. When the driving electrode pattern is an even-numbered row, such as the second driving electrode pattern, a signal line L1 connected to a second end opposite to the first end of the second driving electrode pattern may receive the driving signal.

According to exemplary embodiments, each of the sensing electrode patterns SR1, SR2, SR3, . . . , SRM includes a plurality of electrode columns ER1 and ER2 which are connected to one another. Each of the electrode columns ER1 and ER2 includes at least one second unit pattern UP2. The second unit pattern UP2 may also exhibit a diamond shape and may be configured to include a plurality of sensing lines RL which are connected to one another, such as in a mesh shape. A size of the second unit pattern UP2 may be smaller than that of the previously described second unit patterns.

For example, when each of the sensing electrode patterns SR1, SR2, SR3, . . . , SRM includes K electrode columns ER1, . . . , ERK (where K is a natural, real number), the size of the second unit pattern UP2 exhibiting the diamond shape may be smaller than $1/K^2$ times the size of the second unit pattern UP2 according to the previously described exemplary embodiments.

According to exemplary embodiments, each of the sensing electrode patterns SR1, SR2, SR3, . . . , SRM includes a plurality of electrode columns ER1 and ER2, which are connected to one another. As seen in FIG. 11A, the electrode columns ER1 and ER2 are electrically connected to one another via a second signal line L2, which is disposed on each of the peripheral areas disposed opposite to one another. While not illustrated, the second unit pattern UP2 included in the first electrode column ER1 may be connected to the second unit pattern UP2 included in the second electrode column ER2 adjacent to the first electrode column ER1 in the row direction, so that the electrode columns ER1 and ER2 are electrically connected to one another.

In this manner, the first sensing electrode pattern SR1 may pass the sensing signal to the sensing read out circuit 710 by a dual mode via the second signal lines L2 connected to both ends of the first sensing electrode pattern SR1. The first sensing electrode pattern SR1 may also receive the bias signal from by the dual mode via the second signal lines L2 connected to the both ends of the first sensing electrode pattern SR1.

Alternatively (or additionally), the signal line L2 may be connected to one end of the sensing electrode pattern. In this manner, the sensing electrode pattern may pass the sensing signal L2 to the sensing read out circuit 710 by a single mode via the signal line L2 connected to one end of the sensing electrode pattern. For example, when the sensing electrode pattern is an odd-numbered column, such as the first sensing electrode pattern, a signal line L2 connected to a first end of the first sensing electrode pattern may pass the sensing signal. When the sensing electrode pattern is an even-numbered column, such as the second sensing electrode pattern, a signal line L2 connected to a second end opposite to the first end of the second sensing electrode pattern may pass the sensing signal.

According to exemplary embodiments, the size of the first and second unit patterns UP1 and UP2 may be decreased and a fringe area of the first and second unit patterns UP1 and UP2, which substantially forms the capacitive capacitance Cmutual, may be increased.

In this manner, the size of the first unit pattern UP1 and the second unit pattern UP2 is $1/K^2$ times as small as those of the previously described exemplary embodiments, and the fringe area of the first unit pattern UP1 and the second unit pattern UP2 is K times as large as those of the previous exemplary embodiments. Therefore, the capacitive capacitance Cmutual corresponding to the fringe area of the first unit pattern UP1 and the second unit pattern UP2 may be increased.

In addition, the size of the first unit pattern UP1 and the second unit pattern UP2 may be decreased so that an area which metal material is formed may be decreased. Thus, an RC delay of the first unit pattern UP1 and the second unit pattern UP2 may be improved.

According to exemplary embodiments, the capacitive capacitance Cmutual is increased so that the touch sensing and RC delay may be improved. In addition, and with continued reference to FIGS. 11A and 11B, a sensor resistance of the driving electrode pattern and the sensing electrode pattern is improved and a line resistance of the signal line may be decreased.

For example, when the first driving electrode pattern ST1 includes the first and second electrode rows ET1 and ET2, such as in a dual routing structure, an accumulated resistance of the sensor and the line may be in correspondence with Expression (1).

It is noted that a resistance of the first driving electrode pattern ST1 may be referred to as $c\Omega$, each resistance of the first signal lines L1, which are connected to both ends of the first driving electrode pattern ST1, may be referred to as a $\Omega$, a resistance of the first electrode row ET1 may be referred to as $b\Omega$, and a resistance of the second electrode row ET2 may be referred to as $c\text{-}b\Omega$.

$$R = \frac{(a+b) \times (c-b+a)}{(a+b)+(c-b+a)} \quad \text{Expression (1)}$$
$$= \frac{a^2 + ac + bc - b^2}{2a+c} \left(\text{wherein, } b = \frac{c}{2}\right)$$
$$= \frac{2a+c}{4}$$

As can be discerned from Expression (1), the accumulated resistance may be decreased by as much as about ¼ times. According to exemplary embodiments, the dual routing structure of the driving electrode pattern may enable the sensing display panel 513 to become relatively large.

While not depicted, the driving electrode pattern and the sensing electrode pattern may exhibit a diamond shaped annulus formation similar to that of the previous exemplary embodiments described in association with FIG. 9, or may have a floated dummy pattern similarly configured as in the exemplary embodiments described in association with FIG. 10.

Figure 12:
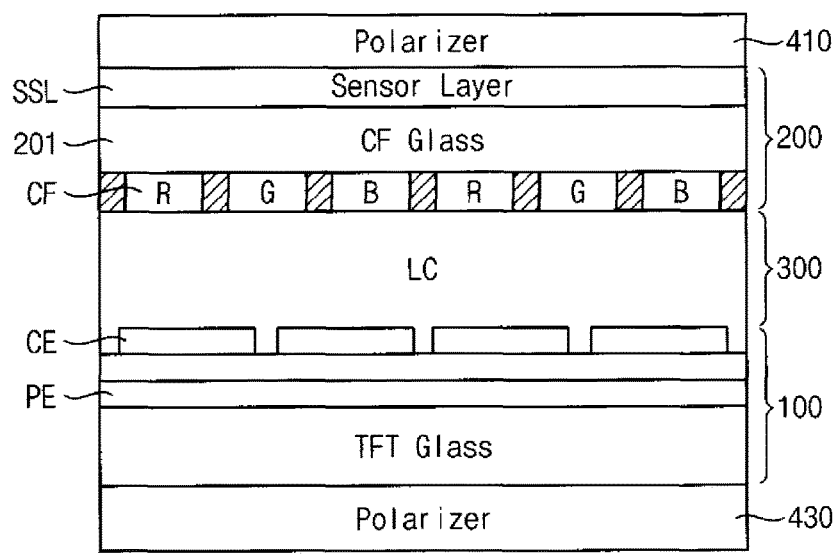
FIG. 12 is a cross-sectional view of a sensing display panel, according to exemplary embodiments.

FIG. 12 is a cross-sectional view of a sensing display panel, according to exemplary embodiments. As previously noted, same reference numerals are used to refer to the same or like components as those previously described. As such, corresponding descriptions are not repeated, unless further-ance of exemplary embodiments would be facilitated by such duplicative description.

Referring to FIG. 12, the sensing display panel 513 includes a display substrate 100, a sensor substrate 200, a liquid crystal layer 300, a first polarizing plate 410, and a second polarizing plate 430. The sensor substrate 200 includes a base substrate 201 and a sensor layer SSL.

The sensor layer SSL may be disposed between the first polarizing plate 410 and the base substrate 201 of the sensor substrate 200.

As shown and described in association with FIGS. 2 and 3, the sensor layer SSL may be configured to include a plurality of driving electrode patterns ST1, ST2, ST3, . . . , STN, a plurality of sensing electrode patterns SR1, SR2, SR3, . . . , SRM, and the driving lines TL. Each of the driving electrode patterns ST1, ST2, ST3, . . . , STN includes a plurality of driving lines TL, which are connected to one another, such as in a mesh shape. Each of the sensing electrode patterns SR1, SR2, SR3, . . . , SRM includes a plurality of sensing lines RL, which are connected to one another, such as in a mesh shape.

Figure 13:
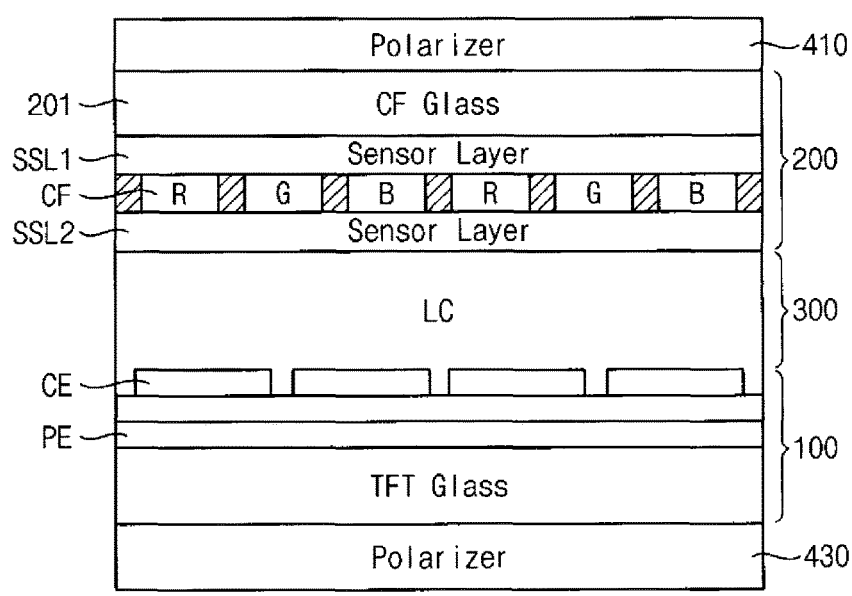
FIG. 13 is a cross-sectional view of a sensing display panel, according to exemplary embodiments.

FIG. 13 is a cross-sectional view of a sensing display panel, according to exemplary embodiments. As previously noted, same reference numerals are used to refer to the same or like components as those previously described. As such, corresponding descriptions are not repeated, unless further-ance of exemplary embodiments would be facilitated by such duplicative description.

Referring to FIG. 13, the sensing display panel 514 includes a display substrate 100, a sensor substrate 200, a liquid crystal layer 300, a first polarizing plate 410, and a second polarizing plate 430. The sensor substrate 200 includes a base substrate 201, a color filter layer CF, a first sensor layer SSL1, and a second sensor layer SSL2.

As shown and described in association with FIGS. 2 and 3, the first sensor layer SSL1 may be configured to include a plurality of sensing electrode patterns SR1, SR2, SR3, . . . , SRM, and each of the sensing electrode patterns SR1, SR2, SR3, . . . , SRM includes a plurality of sensing lines RL, which are connected to one another, such as in a mesh shape. The second sensor layer SSL2 may include a plurality of driving electrode patterns ST1, ST2, ST3, . . . , STN, and each of the driving electrode patterns ST1, ST2, ST3, . . . , STN includes a plurality of driving lines TL, which are connected to one another, such as in a mesh shape.

The first sensor layer SSL1, according to exemplary embodiments, is disposed on the base substrate 201, as well as disposed between the base substrate 201 and the color filter layer CF. Further, the second sensor layer SSL2 may be disposed on the color filter layer CF. The first sensor layer SSL1 and the second sensor layer SSL2 may be insulated from one another by the color filter layer CF.

Figure 14:
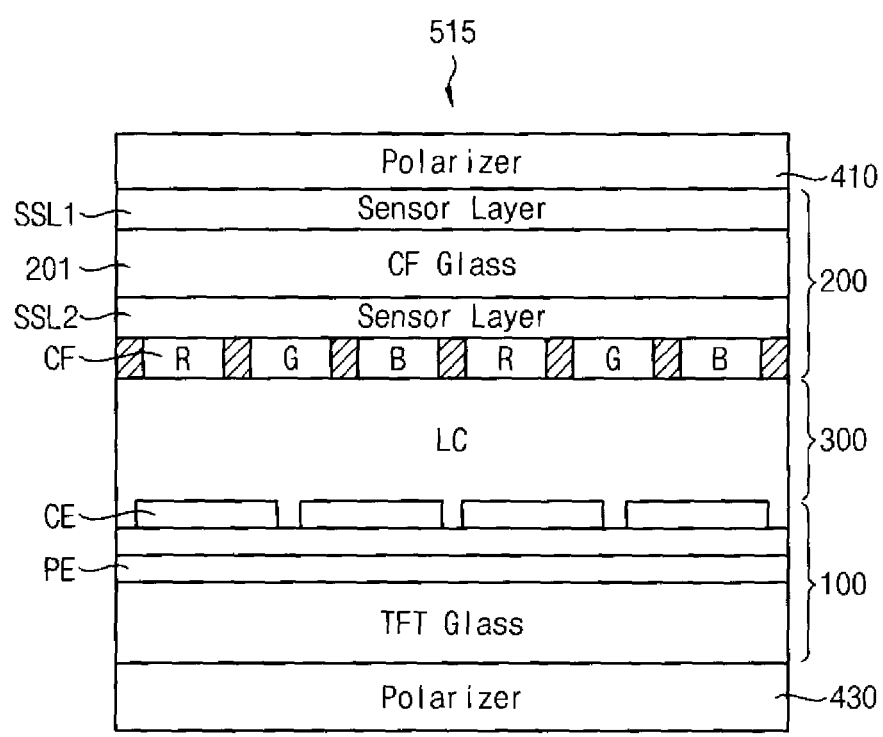
FIG. 14 is a cross-sectional view of a sensing display panel, according to exemplary embodiments.

FIG. 14 is a cross-sectional view of a sensing display panel, according to exemplary embodiments. As previously noted, same reference numerals are used to refer to the same or like components as those previously described. As such, corresponding descriptions are not repeated, unless further-ance of exemplary embodiments would be facilitated by such duplicative description.

Referring to FIG. 14, the sensing display panel 515 includes a display substrate 100, a sensor substrate 200, a liquid crystal layer 300, a first polarizing plate 410, and a second polarizing plate 430. The sensor substrate 200 includes a base substrate 201, a color filter layer CF, a first sensor layer SSL1, and a second sensor layer SSL2.

As previously described in association with FIGS. 2 and 3, the first sensor layer SSL1 may include a plurality of sensing electrode patterns SR1, SR2, SR3, . . . , SRM, and each of the sensing electrode patterns SR1, SR2, SR3, . . . , SRM may include a plurality of sensing lines RL which are connected to one another, such as in a mesh shape. The second sensor layer SSL2 may include a plurality of driving electrode patterns ST1, ST2, ST3, . . . , STN, and each of the driving electrode patterns ST1, ST2, ST3, . . . , STN may include a plurality of driving lines TL, which are connected to one another, such as in a mesh shape.

According to exemplary embodiments, the first sensor layer SSL1 may be disposed on a first surface of the base substrate 201, and the second sensor layer SSL2 may be disposed on a second surface of the base substrate 201 opposite to the first surface. For example, the first sensor layer SSL1 may be disposed between the first polarizing plate 410 and the first surface of the base substrate 201 and the second sensor layer SSL2 may be disposed between the second surface of the base substrate 201 and the color filter layer CF. In this manner, the base substrate 201 may be disposed between the first sensor layer SSL1 and the second sensor layer SSL2, and the first sensor layer SSL1 and the second sensor layer SSL2 may be insulated from one another via the base substrate 201.

To this end, it is noted that each of the sensing display panels described in association with FIGS. 9 to 14 may be driven substantially similarly as described in association with FIG. 7 or FIG. 8. As such, corresponding descriptions are not repeated, unless furtherance of exemplary embodiments would be facilitated by such duplicative description.

Figure 15:
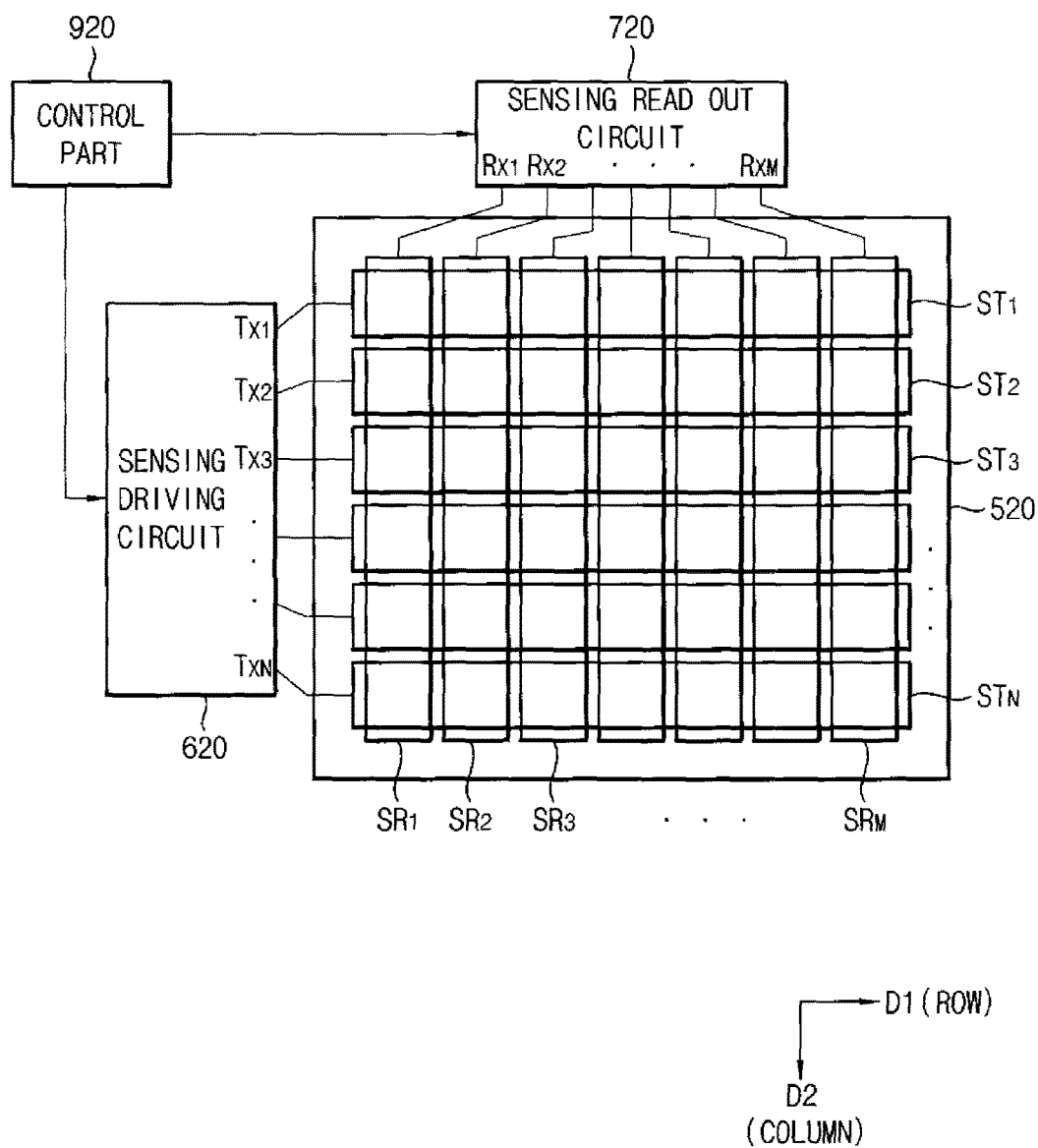
FIG. 15 is a block diagram of a display apparatus incorporating a sensing display panel, according to exemplary embodiments.
Figure 16:
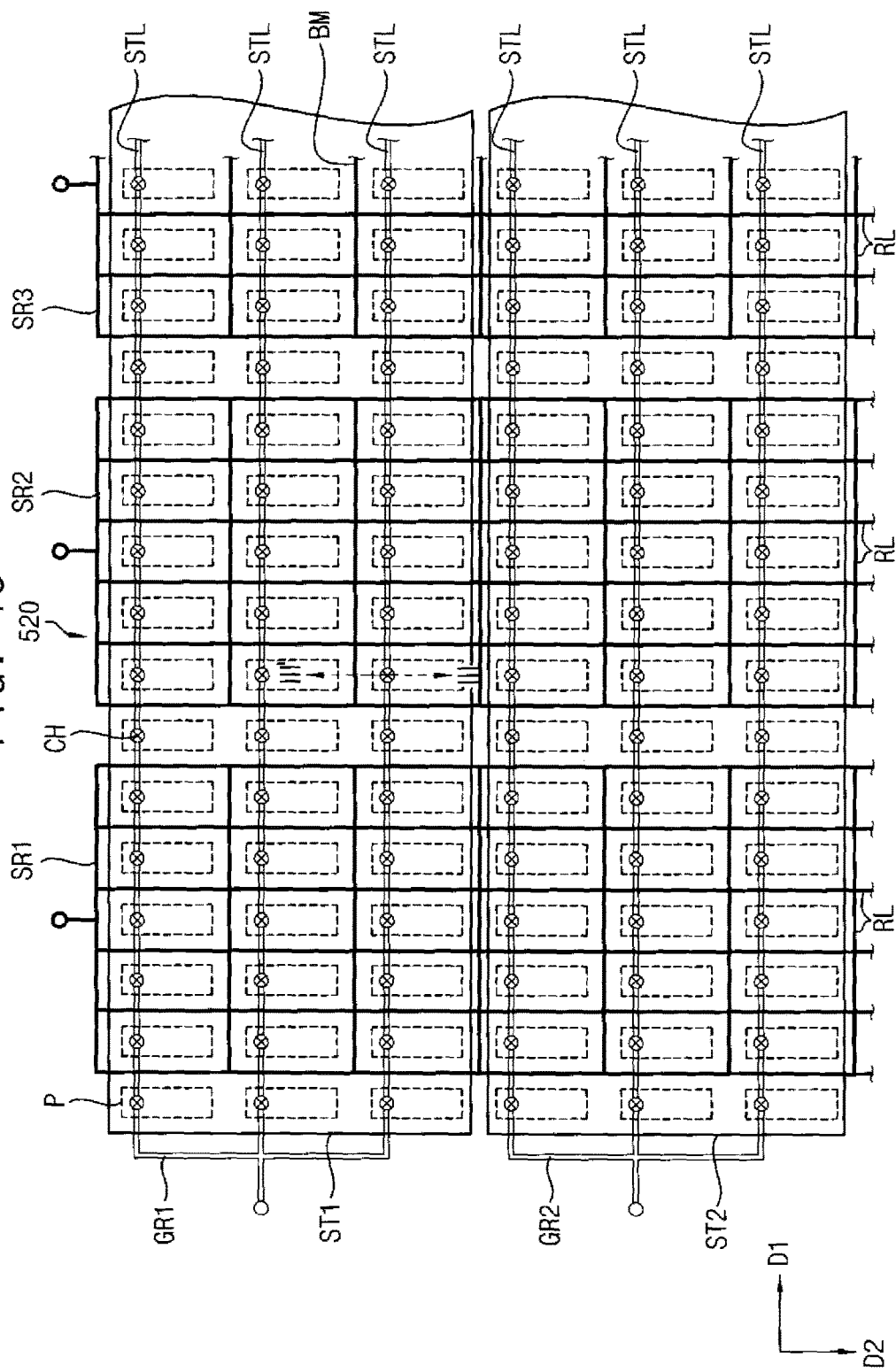
FIG. 16 is a plan view of the sensing display panel of FIG. 15, according to exemplary embodiments.

FIG. 15 is a block diagram of a display apparatus incorporating a sensing display panel, according to exemplary embodiments. FIG. 16 is a plan view of the sensing display panel of FIG. 15.

Referring to FIGS. 15 and 16, the display apparatus includes a sensing display panel 520, a sensing driving circuit 620, a sensing read out circuit 720, and a control part 920. While specific reference will be made to this particular implementation, it is also contemplated that the display apparatus may embody many forms and include multiple and/or alternative components or features. For example, it is contemplated that the components of the display apparatus may be combined, located in separate structures, and/or separate locations.

The sensing display panel 520 includes a plurality of driving electrode patterns ST1, ST2, ST3, . . . , STN and a plurality of sensing electrode patterns SR1, SR2, SR3, . . . , SRM. In this manner, sensing display panel 520 may, according to various exemplary embodiments, be configured as a capacitive touch screen.

The driving electrode patterns ST1, ST2, ST3, . . . , STN are extended in a first direction (e.g., D1), as well as disposed in a second direction (e.g., D2), which may be configured to cross the first direction D1. Each of the driving electrode patterns ST1, ST2, ST3, . . . , STN may include a rectangular shape exhibiting a longitudinal direction corresponding to the first direction D1. Each of the driving electrode patterns ST1, ST2, ST3, . . . , STN may be one electrode pattern corresponding to a plurality of pixels. Each of the driving electrode patterns ST1, ST2, ST3, . . . , STN is electrically connected to a common line STL via at least one contact hole CH.

The common line STL may be extended in the first direction D1, as well as arranged in the second direction D2. Further, the common line STL may be grouped into a common line group including at least one common line STL. For example, common lines included in the sensor display panel 520 may be grouped into N common line groups. The first to N-th common line groups GR1, GR2, . . . , GRN may be individually driven.

The sensing electrode patterns SR1, SR2, SR3, . . . , SRM are extended in the second direction D2, as well as arranged in the first direction D1. Each of the sensing electrode patterns SR1, SR2, SR3, . . . , SRM includes a plurality of sensing lines RL, which are connected to one another, such as in a mesh shape. The sensing lines RL may be configured to overlap the black matrix pattern BM.

According to exemplary embodiments, the sensing driving circuit 620 may be configured to provide the first to N-th common line groups GR1, GR2, . . . , GRN with a common voltage Vcom during an active period of a frame during which image data is provided to the sensing display panel 520. Provision of the image data may be in accordance with one or more control signals received from, for example, control part 920. As such, the common voltage Vcom may be applied to the first to N-th driving electrode patterns ST1, ST2, ST3, . . . , STN, which are electrically connected to the first to N-th common line groups GR1, GR2, . . . , GRN.

Further, the sensing driving circuit 620 may be configured to sequentially provide the driving signal to the first to N-th common line groups GR1, GR2, . . . , GRN during a blanking period of a frame during which the image data is blocked from being applied to the sensing display panel 520, such as in accordance with one or more control signals received from, for example, the control part 920. To this end, the driving signal may be sequentially provided to the first to N-th driving electrode patterns ST1, ST2, ST3, . . . , STN, which may be electrically connected to the first to N-th common line groups GR1, GR2, . . . , GRN.

The sensing read out circuit 720 may be configured to receive the sensing signals Rx1, Rx2, Rx3, . . . , RxM via the sensing electrode patterns SR1, SR2, SR3, . . . , SRM during the blanking period when the driving signal is sequentially applied to the driving electrode patterns ST1, ST2, ST3, . . . , STN based on, for instance, one or more control signals received in association with control part 920.

According to various exemplary embodiments, sensing driving circuit 620, the sensing read out circuit 720, and/or the control part 920 may be implemented via software, hardware, firmware, or a combination thereof. For instance, sensing driving circuit 620, the sensing read out circuit 720, and/or the control part 920 may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the sensing read out circuit 720 may also be configured to provide the sensing display panel 520 with a bias signal, such as a signal exhibiting a DC voltage in accordance with a predetermined voltage level, while the sensing display panel 520 is being driven. In this manner, the static electricity blocking effect may be improved.

Figure 17:
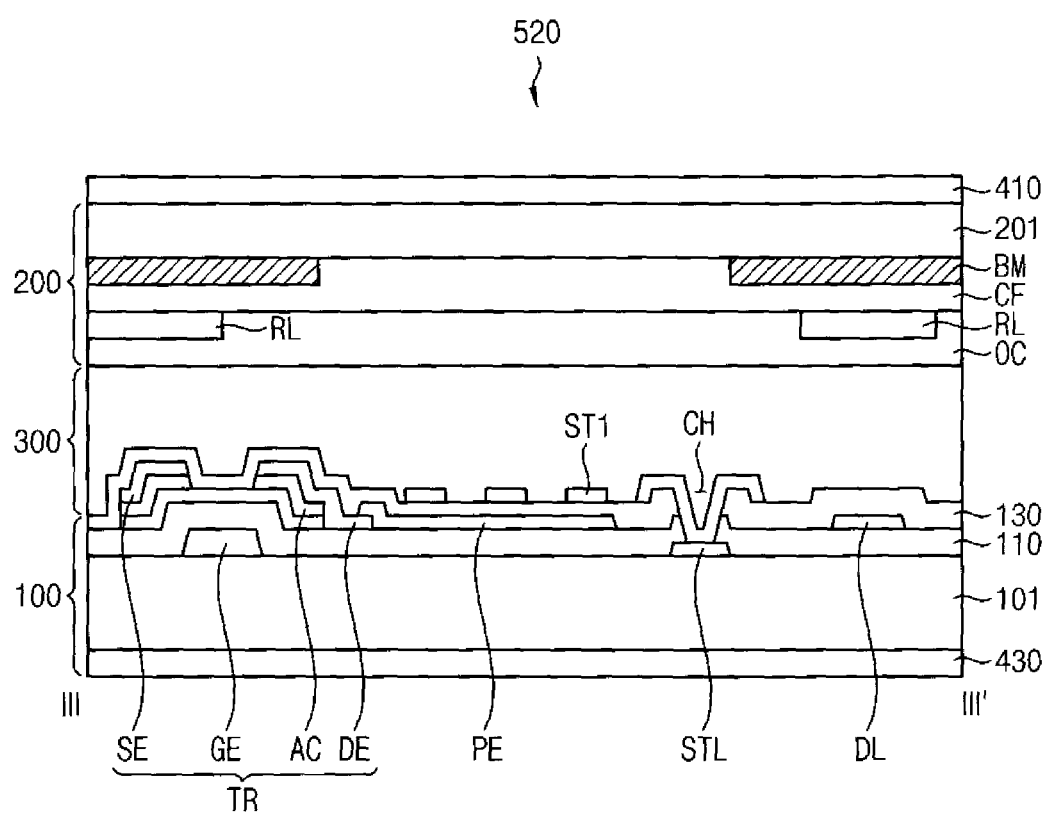
FIG. 17 is a cross-sectional view of the sensing display panel of FIG. 16 taken along sectional line III-III', according to exemplary embodiments.

FIG. 17 is a cross-sectional view of the sensing display panel of FIG. 16 taken along sectional line III-III', according to exemplary embodiments. As previously noted, same reference numerals are used to refer to the same or like components as those previously described. As such, corresponding descriptions are not repeated, unless furtherance of exemplary embodiments would be facilitated by such duplicative description.

As seen in FIGS. 16 and 17, the sensing display panel 520 includes a display substrate 100, a sensor substrate 200 opposite to the display substrate 100, and a liquid crystal layer 300 disposed between the display substrates 100 and the sensor substrate 200. The sensing display panel 520 may further include a first polarizing plate 410 disposed on the sensor substrate 200 and a second polarizing plate 430 disposed under the display substrate 100.

According to exemplary embodiments, the display substrate 100 includes a first base substrate 101, a gate line GL (not shown), a common line STL, a gate insulating layer 110, a data line DL, a switching element TR, a pixel electrode PE, a protecting layer 130, and a plurality of driving electrode patterns ST1, ST2, ST3, . . . , STN.

The gate line GL is extended in the first direction D1 and may be configured to overlap the black matrix pattern BM. The gate line GL may be electrically connected to a gate electrode GE of the switching element TR.

The common line STL may be parallel to the gate line GL. The common line STL is electrically connected to a corresponded driving electrode pattern via the contact hole CH. For example, the common line STL may be electrically connected to the first driving electrode pattern STD1, such as shown in FIGS. 16 and 17.

The gate insulating layer 110 may be disposed on the first base substrate 101 and, thereby, utilized to cover the gate line GL, the gate electrode GE, and the common line STL.

The data line DL may be configured to overlap the black matrix pattern BM, which is extended in the second direction D2. The data line DL may be electrically connected to a source electrode SE of the switching element TR.

The switching element TR includes an active layer AC, which may be disposed between the gate electrode GE and the source electrode SE and the drain electrode DE.

The pixel electrode PE may be disposed on a pixel area, which is defined by the black matrix pattern BM, and is electrically connected to the drain electrode DE of the switching element TR so as to receive a data voltage.

The protecting layer 130 may be disposed on the first base substrate 101 and, thereby, utilized to cover the data line DL, the source electrode SE, and the pixel electrode PE.

According to exemplary embodiments, the driving electrode pattern ST1 is disposed corresponding to pixel electrodes PE included in at least one pixel row. The driving electrode pattern ST1 is disposed in an area in which a plurality of pixel rows corresponding to a first common line group GR1 is disposed. As such, the sensor display panel 520 may be configured to include the first to N-th driving electrode patterns ST1, ST2, ST3, . . . , STN, which are extended in the first direction D1, as well as arranged in the second direction D2. Further, each of the first to N-th driving electrode patterns ST1, ST2, ST3, . . . , STN may include a slit pattern and, thereby, define a pixel area unit. To this end, the driving electrode patterns ST1, ST2, ST3, . . . , STN may be utilized for both sensing touches and/or "near" touches, and displaying images.

The sensor substrate 200 includes a second base substrate 201, a black matrix pattern BM, a plurality of sensing electrode patterns SR1, SR2, SR3, . . . , SRM, color filter layer CF, and an overcoating layer OC.

The black matrix pattern BM divides the second base substrate 201 into a transmission area and a blocking area and exhibits a matrix shape.

The color filter layer CF includes a plurality of color filters, such as a red color filter, a green color filter, a blue color filter, etc. Each color filter may be disposed in the transmission area, which is defined in association with the black matrix pattern BM. It is noted that the transmission area may corresponding to a light transmission area in which images may be displayed. To this end, the transmission area may relate to an image display area.

The sensing electrode patterns SR1, SR2, SR3, . . . , SRM are disposed on the color filter layer CF. The sensing electrode patterns SR1, SR2, SR3, . . . , SRM are extended in the second direction D2, as well as arranged in the first direction D1. Each of the sensing electrode patterns SR1, SR2, SR3, . . . , SRM includes a plurality of sensing lines RL, which are connected to one another, such as in a mesh shape. The sensing lines RL may be configured to overlap with the black matrix pattern BM.

The overcoating layer OC is disposed on the sensing electrode patterns SR1, SR2, SR3, . . . , SRM. To this end, the overcoating layer OC may be planarized so that a surface of the sensor substrate 200 may be flat or substantially flat.

According to exemplary embodiments, the driving electrode pattern is used as the common electrode CE of the sensing display panel 510 so that, for instance, a structure and various processes of the sensor substrate 200 may be simplified.

According to exemplary embodiments, the sensor substrate 200 includes the sensing electrode patterns SR1, SR2, SR3, . . . , SRM, which are formed with metal material so that the sensing touch panel 520 may be protected from the deleterious effects associated with static electricity. In this manner, the sensing display panel 520 may be configured without conventional static electricity blocking layer(s) typically utilized to blocking static electricity effects.

Figure 18:
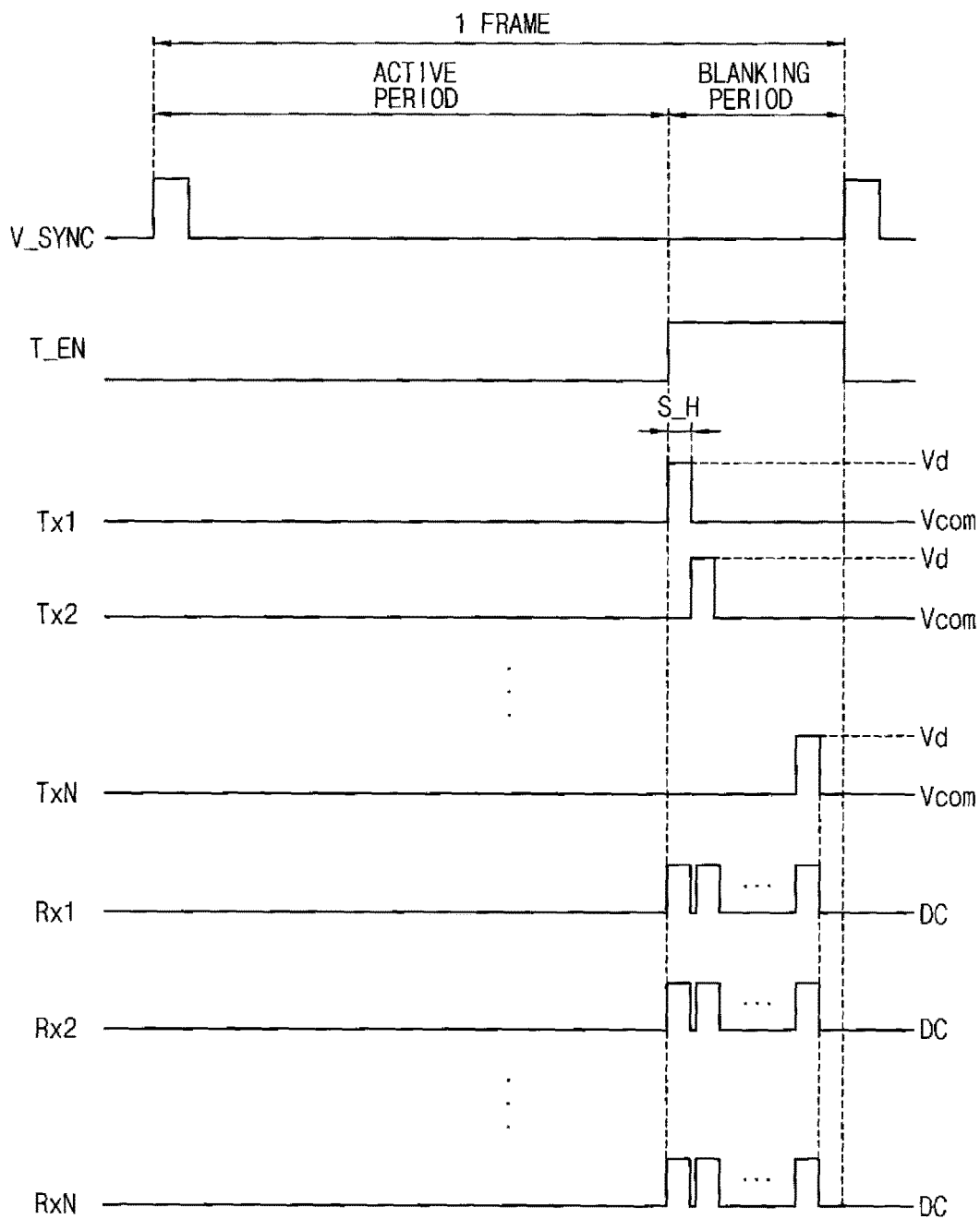
FIG. 18 is a waveform diagram associated with driving the sensing display panel of FIG. 15, according to exemplary embodiments.

FIG. 18 is a waveform diagram associated with driving the sensing display panel of FIG. 15, according to exemplary embodiments.

With continued reference to FIGS. 15 and 17, the sensor display panel 520 is configured to display an image during an active period of a frame period and to sense a touch during a blanking period of a frame period based on a vertical synchronization signal V_SYNC, as seen in FIG. 18. For example, the sensor display panel 520 may be configured to sense a touch on a surface of the sensor display panel 520 during a blanking period based on a touch enable signal T_EN.

The sensing driving circuit 620 may be configured to provide the first to N-th driving electrode patterns ST1, ST2, ST3, . . . , STN with first to N-th driving signals Tx1, Tx2, Tx3, . . . , TxN via the first to N-th common line groups GR1, GR2, . . . , GRN, respectively.

During an active period, e.g., when the sensing display panel 520 is configured to display an image, the sensing driving circuit 620 is configured to provide the first to N-th driving electrode patterns ST1, ST2, ST3, . . . , STN with the common voltage Vcom so that the first to N-th driving electrode patterns ST1, ST2, ST3, . . . , STN may be driven as the common electrode of the pixel electrode PE. Each of the first to N-th driving signals Tx1, Tx2, Tx3, . . . , TxN, which are applied to each of the first to N-th driving electrode patterns ST1, ST2, ST3, . . . , STN during the active period, is the common voltage Vcom.

During the blanking period, e.g., when the sensing display panel 520 is configured to sense a touch on a surface thereof, the sensing driving circuit 620 is configured to sequentially provide the first to N-th driving electrode patterns ST1, ST2, ST3, . . . , STN with a driving signal exhibiting a predetermined voltage level. The driving signal exhibits a level Vd which is equal to or different than the common voltage Vcom. The driving signal may exhibit a width corresponding to the sensing horizontal period S_H, and may include at least one pulse.

For example, while a first driving signal Tx1 is being applied to the first driving electrode pattern ST1, the common voltage Vcom (as a bias signal) may be applied to the remainder of the second to N-th driving electrode patterns ST2, ST3, . . . , STN, i.e., all of the driving electrode patterns except for the first driving electrode pattern ST1. As described above, while a second driving signal Tx2 is being applied to the second driving electrode pattern ST2, the common voltage Vcom (as the bias signal) may be applied to the remainder of the first driving electrode pattern ST1 and the third to N-th driving electrode patterns ST3, . . . , STN, i.e., all of the driving electrode patterns except for the second driving electrode pattern ST2.

During the active period, the sensing read out circuit 720 is configured to provide the sensing electrode patterns SR1, SR2, SR3, . . . , SRM with the DC voltage exhibiting the predetermined voltage level as the bias signal.

During the blanking period, the sensing read out circuit 720 is configured to provide the sensing electrode patterns SR1, SR2, SR3, . . . , SRM with the bias signal and further configured to receive sensing signals Rx1, Rx2, Rx3, . . . , RxM from the sensing electrode patterns SR1, SR2, SR3, . . . , SRM.

According to exemplary embodiments, while the sensor display panel 520 is being driven, the sensing read out circuit 720 may be configured to provide the first to M-th sensing electrode patterns SR1, SR2, SR3, . . . , SRM with the DC voltage exhibiting the predetermined voltage level (as the bias signal) so that a static electricity blocking effect may be improved via the sensor patterns SR1, SR2, SR3, . . . , SRM.

Figure 19:
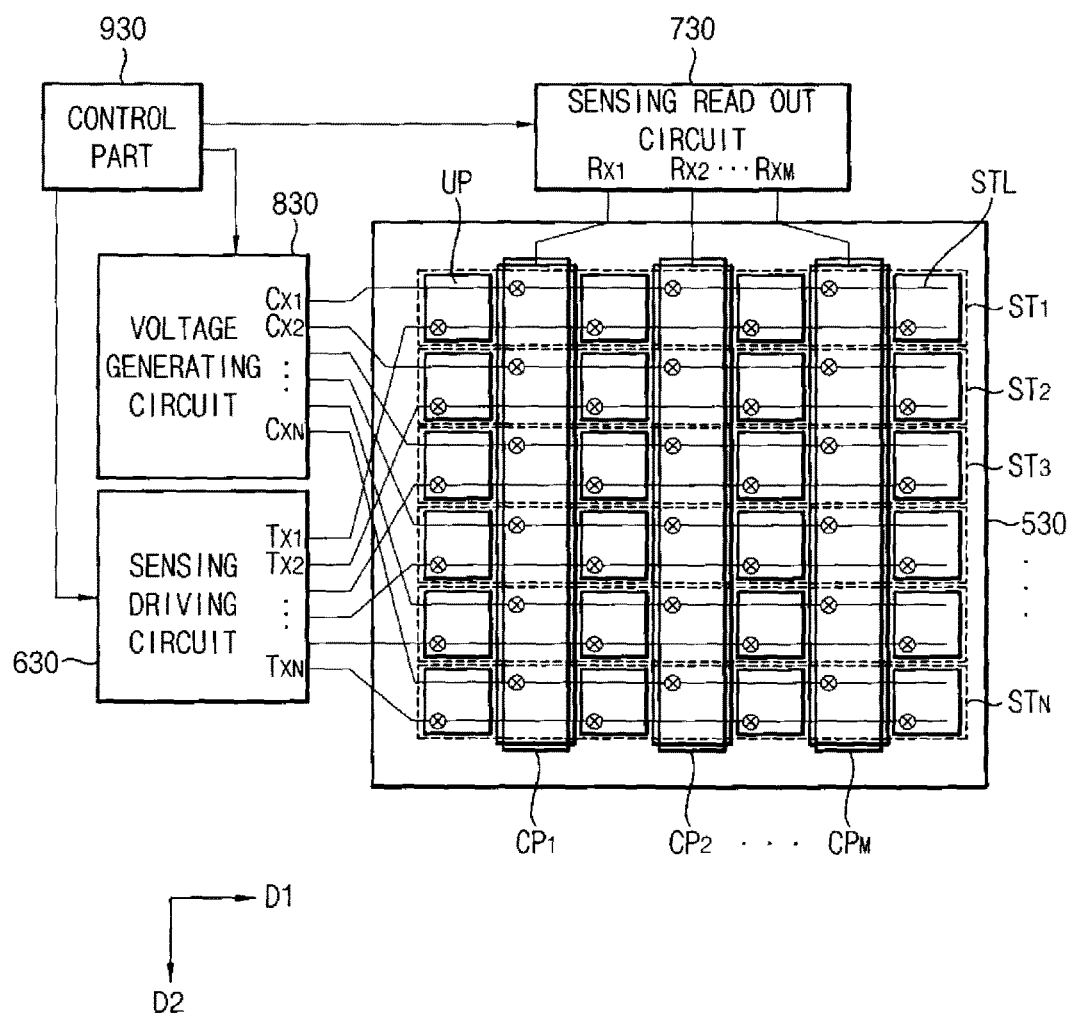
FIG. 19 is a block diagram of a display apparatus incorporating a sensing display panel, according to exemplary embodiments.
Figure 20:
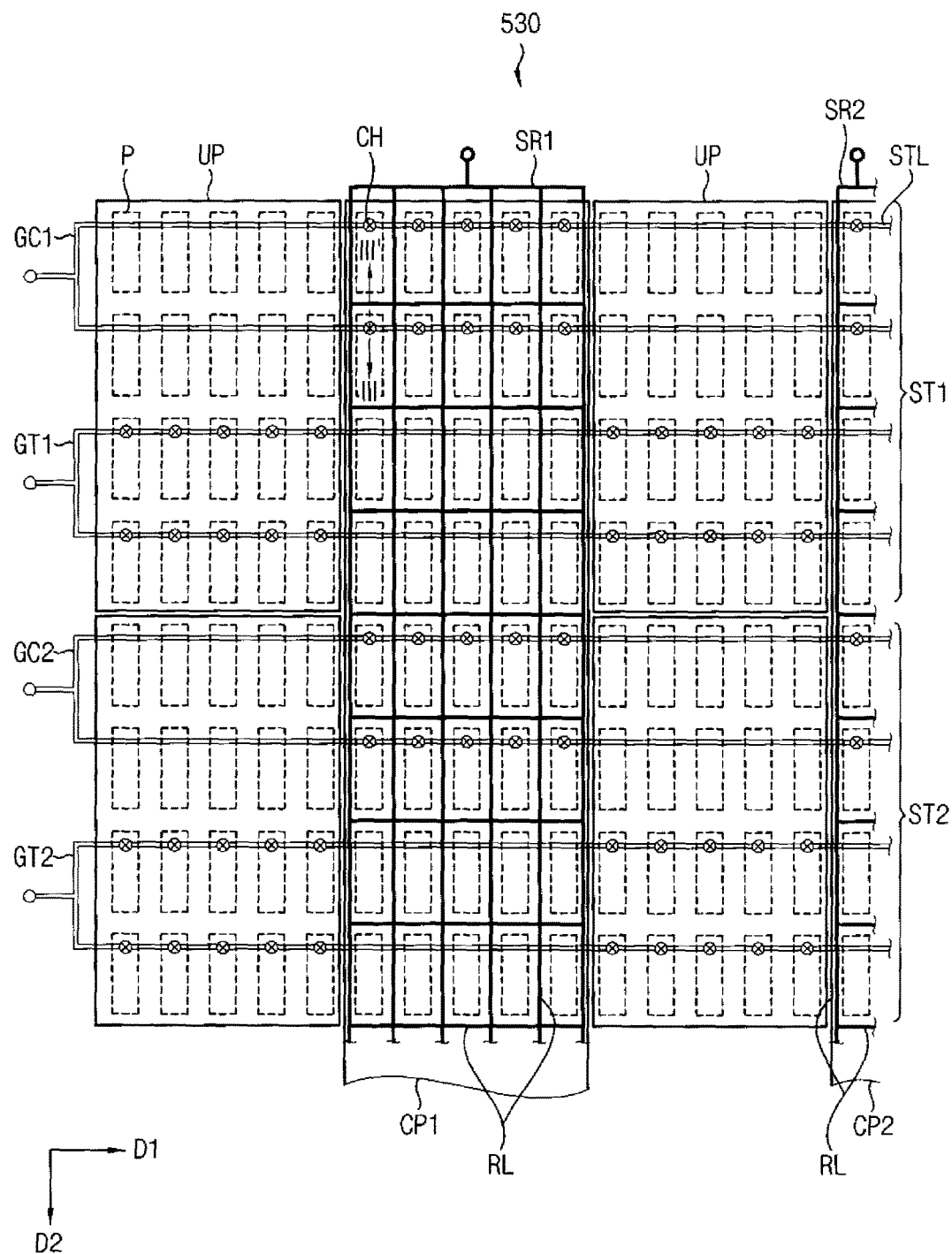
FIG. 20 is a plan view of the sensing display panel of FIG. 19, according to exemplary embodiments.

FIG. 19 is a block diagram of a display apparatus incorporating a sensing display panel, according to exemplary embodiments. FIG. 20 is a plan view of the sensing display panel of FIG. 19.

As seen in FIGS. 19 and 20, the display apparatus includes a sensing display panel 530, a sensing driving circuit 630, a voltage generating circuit 830, a sensing read out circuit 730, and a control part 930. While specific reference will be made to this particular implementation, it is also contemplated that the display apparatus may embody many forms and include multiple and/or alternative components or features. For example, it is contemplated that the components of the display apparatus may be combined, located in separate structures, and/or separate locations.

According to exemplary embodiments, the sensing display panel 520 includes a plurality of driving electrode patterns ST1, ST2, ST3, . . . , STN and a plurality of sensing electrode patterns SR1, SR2, SR3, . . . , SRM. In this manner, the sensing display panel 520 may be configured in accordance with (or otherwise implement) a capacitive touch screen. Further, the sensing display panel 530 may include a plurality of common electrode patterns CP1, CP2, . . . , CPM.

The driving electrode patterns ST1, ST2, ST3, . . . , STN may be extended in a first direction, e.g., D1, as well as be arranged in a second direction, e.g., D2, which may be configured to cross the first direction D1. Each of the driving electrode patterns ST1, ST2, ST3, . . . , STN may include a plurality of unit patterns UP. The unit patterns UP may be spaced apart from one another. The unit patterns UP included in one driving electrode pattern are electrically connected to one another via a common line STL. Each of the unit patterns UP may be formed as one electrode pattern corresponding to the pixel electrodes arranged in a matrix shape. The driving electrode patterns ST1, ST2, ST3, . . . , STN are electrically connected to the common line STL via at least one contact hole CH.

The sensing electrode patterns SR1, SR2, SR3, . . . , SRM are extended in the second direction D2, as well as arranged in the first direction D1. The driving electrode patterns ST1, ST2, ST3, . . . , STN are alternately arranged with the unit patterns UP. Each of the sensing electrode patterns SR1, SR2, SR3, . . . , SRM includes a plurality of sensing lines RL, which are connected to one another, such as in a mesh shape. The sensing lines RL may be configured to overlap the black matrix pattern BM.

The common electrode patterns CP1, CP2, . . . , CPM are configured to overlap with the sensing electrode patterns SR1, SR2, SR3, . . . , SRM, and are alternately arranged with the unit patterns UP. Each of the common electrode patterns CP1, CP2, . . . , CPM may be formed as one electrode pattern. Each of the common electrode patterns CP1, CP2, . . . , CPM may be disposed in an area in which the pixel electrodes arranged in at least one column and overlap with the corresponded sensing electrode pattern. The common electrode patterns CP1, CP2, . . . , CPM are electrically connected to the common line STL via at least one contact hole CH.

A plurality of common lines STL are extended in the first direction D1 and arranged in the second direction D2. The common lines STL may be grouped into a plurality of driving groups and each of the driving groups may include at least one common line STL. For example, the common lines STL included in the sensor display panel 530 may be divided into first to N-th common groups GC1, GC2, . . . , GCN and first to N-th driving groups GT1, GT2, . . . , GTN, and each group may be individually driven. As depicted in FIG. 20, the first to N-th driving groups GT1, GT2, . . . , GTN may be alternately arranged with the first to N-th common groups GC1, GC2, . . . , GCN.

The first to N-th common groups GC1, GC2, . . . , GCN are electrically connected to the common electrode patterns CP1, CP2, . . . , CPM via at least one contact hole CH, respectively.

According to exemplary embodiments, the first to N-th driving groups GT1, GT2, . . . , GTN are electrically connected to the driving electrode patterns ST1, ST2, ST3, . . . , STN via at least one contact hole CH, respectively. As seen in FIG. 20, a first driving group GT1 is electrically connected to the unit patterns UP associated with the first driving electrode pattern ST1 via at least one contact hole CH. A second driving group GT2 is electrically connected to the unit patterns UP associated with the second driving electrode pattern ST2 via at least one contact hole CH. As described above, each driving group is electrically connected to the corresponded driving electrode pattern.

The sensing driving circuit 630 is configured to provide the first to N-th driving groups GT1, GT2, . . . , GTN with a common voltage Vcom during an active period of a frame during which image data may be provided to the sensing display panel 530 based on, for example, one or more control signals received from the control part 930. Further, the sensing driving circuit 630 may be configured to sequentially provide the driving signal with the first to N-th driving groups GT1, GT2, . . . , GTN during a blanking period of a frame during which the image data is blocked from being applied to the sensing display panel 530 based on, for instance, one or more control signals received from the control part 930. Accordingly, the driving signal may be sequentially applied to the first to N-th driving electrode patterns ST1, ST2, ST3, ..., STN.

According to exemplary embodiments, the voltage generating circuit 830 may be configured to provide the first to N-th common groups GC1, GC2, ..., GCN with common voltage Vcom during the active period based on, for instance, one or more control signals received from the control part 930. The voltage generating circuit 830 may also be configured to block the common voltage Vcom from being applied to the first to N-th common groups GC1, GC2, ..., GCN during the blanking period based on one or more control signal received from, for instance, the control part 930. Alternatively (or additionally), the voltage generating circuit 830 may be configured to provide the first to N-th common groups GC1, GC2, ..., GCN with a ground voltage GND during the blanking period according to one or more control signals received from, for example, the control part 930. To this end, during the blanking period, the common electrode patterns CP1, CP2, ..., CPM may be electrically floated, or receive the ground voltage GND.

The sensing read out circuit 730 may be configured to receive the sensing signals Rx1, Rx2, Rx3, ..., RxM from the sensing electrode patterns SR1, SR2, SR3, ..., SRM during the blanking period when the driving signal is being applied to the driving electrode patterns ST1, ST2, ST3, ..., STN, such as, in accordance with one or more control signal received from the control part 930. In this manner, the sensing read out circuit 730 may be configured to provide the sensing electrode patterns SR1, SR2, SR3, ..., SRM with the bias signal, such as the DC voltage exhibiting a predetermined voltage level, as well as configured to receive the sensing signals Rx1, Rx2, Rx3, ..., RxM from the sensing electrode patterns SR1, SR2, SR3, ..., SRM while the sensing display panel 530 is being driven. Accordingly, the bias signal may be applied to the sensing electrode patterns SR1, SR2, SR3, ..., SRM while the sensing display panel 530 is being driven so that a static electricity blocking effect may be improved.

The cross-sectional view of the sensing display panel 530 taken along sectional line III-III' in FIG. 20 is substantially the same as the cross-sectional view of the sensing display panel 520 and, therefore, duplicative description need not be provided.

According to exemplary embodiments, it is noted that the common electrode CE included in the sensing display panel 510 may be used as the driving electrode pattern for sensing a touch (or near touch) so that a structure and processes of the sensing display panel 530 may be simplified.

According to exemplary embodiments, static electricity may be blocked by the sensing electrode patterns SR1, SR2, SR3, ..., SRM, which are included in the sensor substrate 200, and are formed with metal. Further, a bias signal may be applied to the sensing electrode patterns SR1, SR2, SR3, ..., SRM so that a static electricity blocking effect may be improved.

Figure 21:
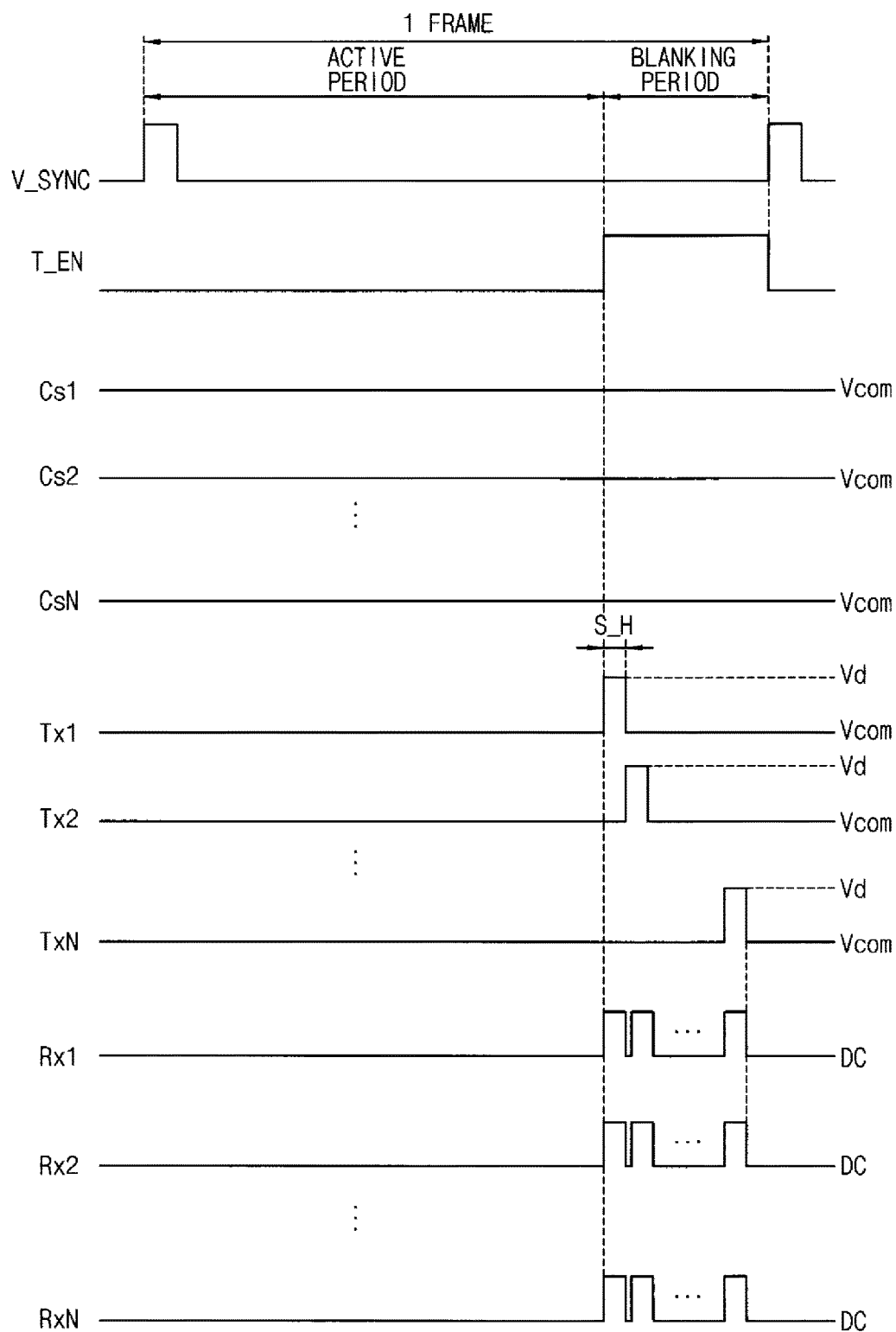
FIG. 21 is a waveform diagram associated with driving the sensing display panel of FIG. 19, according to exemplary embodiments.

FIG. 21 is a waveform diagram associated with driving the sensing display panel of FIG. 19, according to exemplary embodiments.

With reference to FIGS. 19, 20, and 21, the sensor display panel 530 may be configured to display an image during an active period of a frame period and sense a touch (or near touch) during a blanking period of a frame period based on a vertical synchronization signal V_SYNC. For example, the sensor display panel 530 may sense touches during the blanking period based on a touch enable signal T_EN.

To this end, the sensing driving circuit 630 may be configured to provide the first to N-th driving electrode patterns ST1, ST2, ST3, ..., STN with the first to N-th driving signals Tx1, Tx2, Tx3, ..., TxN via the first to N-th driving groups GT1, GT2, ..., GTN, respectively.

During the active period when the sensing display panel 530 is configured to display image(s), the sensing driving circuit 630 may be configured to provide the first to N-th driving electrode patterns ST1, ST2, ST3, ..., STN with the common voltage Vcom so that the first to N-th driving electrode patterns ST1, ST2, ST3, ..., STN may be driven as the common electrode of the pixel electrode PE. Each of the first to N-th driving signals Tx1, Tx2, Tx3, ..., TxN, which are applied to each of the first to N-th driving electrode patterns ST1, ST2, ST3, ..., STN during the active period, is the common voltage Vcom.

During the blanking period when which the sensing display panel 530 is configured to sense touches, the sensing driving circuit 630 may be configured to sequentially provide the first to N-th driving electrode patterns ST1, ST2, ST3, ..., STN with a driving signal exhibiting a predetermined voltage level. The driving signal exhibits a level voltage Vd, which is equal to or different than the common voltage Vcom. The driving signal may exhibit a width corresponding to the sensing horizontal period S_H and may include at least one pulse.

For example, while a first driving signal Tx1 is being applied to the first driving electrode pattern ST1, the common voltage Vcom (as a bias signal) may be applied to the remainder of the second to N-th driving electrode patterns ST2, ST3, ..., STN, i.e., all of the driving electrode patterns except for the first driving electrode pattern ST1. As described above, when a second driving signal Tx2 is applied to the second driving electrode pattern ST2, the common voltage Vcom (as the bias signal) may be applied to the remainder of the first driving electrode pattern ST1 and the third to N-th driving electrode patterns ST3, ..., STN, i.e., all of the driving electrode patterns except for the second driving electrode pattern ST2.

According to exemplary embodiments, the voltage generating circuit 830 may be configured to provide the first to M-th common electrode patterns CP1, CP2, ..., CPM with first to N-th voltage signals Cs1, Cs2, Cs3, ..., CsN via the first to N-th common groups GC1, GC2, ..., GCN, respectively.

For example, during the active period, the voltage generating circuit 830 may be configured to provide the first to M-th common electrode patterns CP1, CP2, ..., CPM with first to N-th voltage signals Cs1, Cs2, Cs3, ..., CsN, which are the same as the common voltage Vcom.

Further, during the blanking period, the voltage generating circuit 830 may be configured to provide the first to M-th common electrode patterns CP1, CP2, ..., CPM with first to N-th voltage signals Cs1, Cs2, Cs3, ..., CsN, which are the same as the common voltage Vcom.

During the active period, the sensing read out circuit 730 may be configured to provide the sensing electrode patterns SR1, SR2, SR3, ..., SRM with the bias signal, such as the DC voltage exhibiting the predetermined voltage level or the ground voltage.

Moreover, during the blanking period, the sensing read out circuit 730 may be configured to receive the sensing signals Rx1, Rx2, Rx3, ..., RxM from the sensing electrode patterns SR1, SR2, SR3, ..., SRM.

Accordingly, the driving electrode pattern and the sensing electrode pattern may be spaced apart from each other so that the fringe area of the driving electrode pattern and the sensing electrode pattern may be increased. To this end, a touch sensing efficiency may be increased. Further, it is noted that the shape of the unit pattern UP may correspond to any suitable shape, such as, for example, a lozenge shape, a square shape, a rectangular shape, etc.

According to exemplary embodiments, the sensing read out circuit 730 may be configured to provide the first to M-th sensing electrode patterns SR1, SR2, SR3, ..., SRM with the bias signal, such as the DC voltage exhibiting the predetermined voltage level or the ground voltage, during a frame in which the sensor display panel 530 is being driven so that a static electricity blocking effect may be improved by the sensor patterns SR1, SR2, SR3, ..., SRM.

Figure 22:
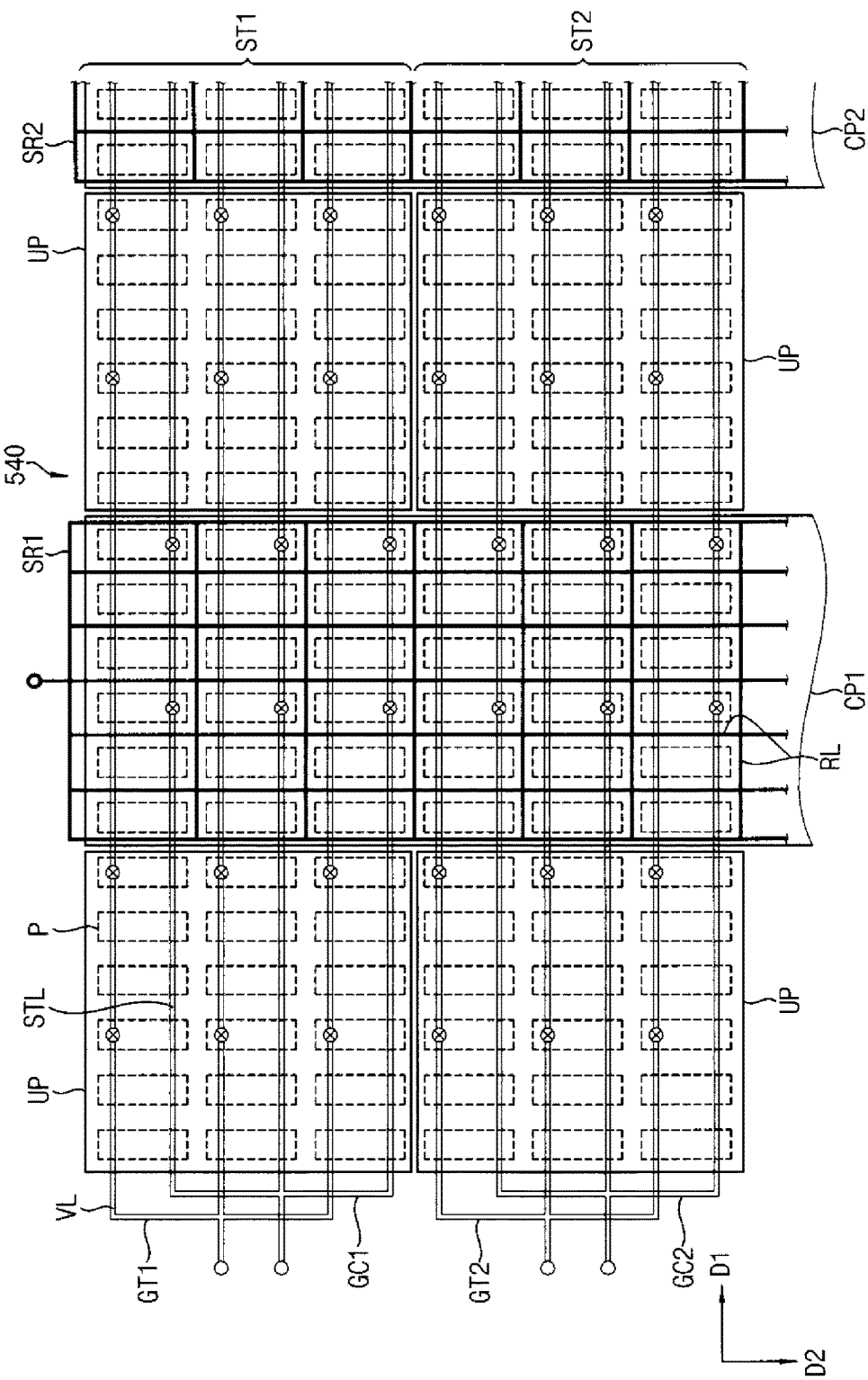
FIG. 22 is a plan view of a sensing display panel, according to exemplary embodiments.

FIG. 22 is a plan view of a sensing display panel, according to exemplary embodiments. As previously noted, same reference numerals are used to refer to the same or like components as those previously described. As such, corresponding descriptions are not repeated, unless furtherance of exemplary embodiments would be facilitated by such duplicative and/or simplified descriptions thereof.

Adverting to FIGS. 19 and 22, the sensing display panel 540 further includes a plurality of voltage lines VL. In comparison to the sensing display panel 530, the voltage lines VL may be electrically connected to the driving electrode patterns ST1, ST2, ST3, ..., STN via the contact hole and may be parallel (or substantially parallel) to the common line STL.

The sensing display panel 540 includes a plurality of driving electrode patterns ST1, ST2, ST3, ..., STN, a plurality of sensing electrode patterns SR1, SR2, SR3, ..., SRM, and a plurality of common electrode patterns CP1, CP2, ..., CPM. In this manner, sensing display panel 540 may be configured in association with or to implement a capacitive touch screen.

The driving electrode patterns ST1, ST2, ST3, ..., STN include a plurality of unit patterns UP, which are spaced apart from one another, and the unit patterns UP included in one driving electrode pattern are electrically connected to the voltage line VL via at least one contact hole CH.

The sensing electrode patterns SR1, SR2, SR3, ..., SRM are extended in a second direction (e.g., D2), as well as arranged in a first direction (e.g., D1). In this manner, the sensing electrode patterns SR1, SR2, SR3, ..., SRM may be alternately arranged with the unit patterns UP of the driving electrode patterns ST1, ST2, ST3, ..., STN. Each of the sensing electrode patterns SR1, SR2, SR3, ..., SRM includes a plurality of sensing lines RL, which are connected to one another, such as in a mesh shape.

The common electrode patterns CP1, CP2, ..., CPM may be configured to overlap the sensing electrode patterns SR1, SR2, SR3, ..., SRM, and may be alternately arranged with the unit patterns UP. Each of the common electrode patterns CP1, CP2, ..., CPM may be formed as one electrode pattern. Each of the common electrode patterns CP1, CP2, ..., CPM may be disposed in an area in which the pixel electrodes are arranged in at least one column and overlap with the corresponded sensing electrode pattern. The common electrode patterns CP1, CP2, ..., CPM may be electrically connected to the common line STL via at least one contact hole CH.

The common lines STL of the sensor display panel 540 may be divided into first to N-th common groups GC1, GC2, ..., GCN and the voltage lines VL of the sensor display panel 540 may be divided into first to N-th driving groups GT1, GT2, ..., GTN. Each group may be individually driven.

The first to N-th common groups GC1, GC2, ..., GCN may be electrically connected to the common electrode patterns CP1, CP2, ..., CPM via at least one contact hole CH. The first to N-th driving groups GT1, GT2, ..., GTN may be electrically connected to the driving electrode patterns ST1, ST2, ST3, ..., STN via at least one contact hole CH.

Alternatively, when the display substrate includes the common lines STL and does not include the voltage lines VL, the common lines STL may be divided into the common groups GC1, GC2, ..., GCN and the driving groups GT1, GT2, ..., GTN.

According to exemplary embodiments, the sensing driving circuit 630 may be configured to provide the first to N-th driving groups GT1, GT2, ..., GTN with the common voltage Vcom during the active period of a frame. The sensing driving circuit 630 may also be configured to sequentially provide the first to N-th driving groups GT1, GT2, ..., GTN with the driving signal during the blanking period of the frame. As such, the driving signal may be sequentially applied to the first to N-th driving electrode patterns ST1, ST2, ST3, ..., STN.

According to exemplary embodiments, the voltage generating circuit 830 may be configured to provide the first to M-th common electrode patterns CP1, CP2, ..., CPM with the common voltage Vcom via the first to N-th common groups GC1, GC2, ..., GCN during the active period. The voltage generating circuit 830 may also be configured to provide the first to M-th common electrode patterns CP1, CP2, ..., CPM with the common voltage Vcom via the first to N-th common groups GC1, GC2, ..., GCN during the blanking period.

As described above, the sensing display panel 540 may be driven substantially the same as the sensor display panel 530.

Figure 23:
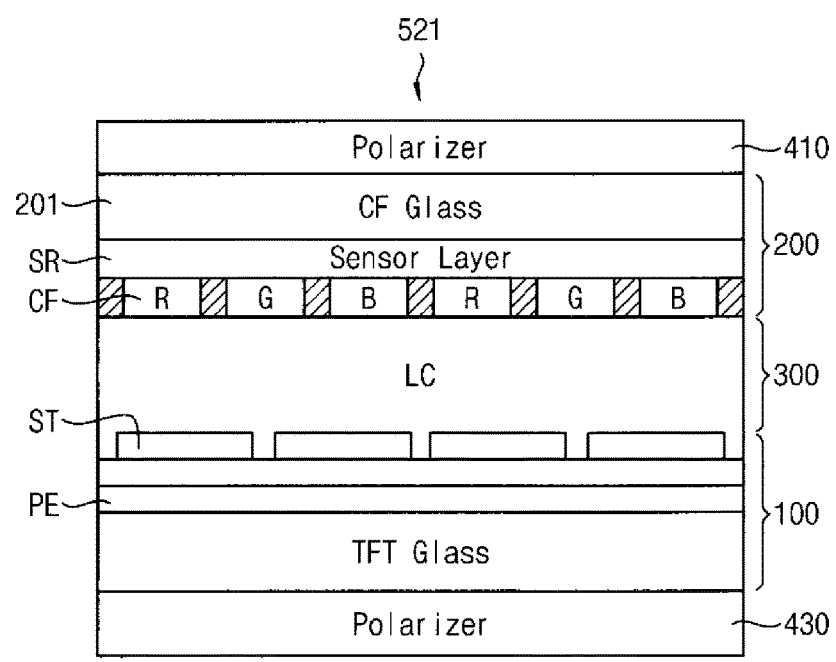
FIG. 23 is a cross-sectional view of a sensing display panel, according to exemplary embodiments.

FIG. 23 is a cross-sectional view of a sensing display panel, according to exemplary embodiments. As previously noted, same reference numerals are used to refer to the same or like components as those previously described. As such, corresponding descriptions are not repeated, unless furtherance of exemplary embodiments would be facilitated by such duplicative description.

With reference to FIGS. 17 and 23, the sensing display panel 521 includes the sensing electrode pattern SR, which is disposed between the base substrate 201 of the sensor substrate 200 and the color filter layer CF in comparison to the sensing display panel 520 described in association with FIG. 17.

The remainder of the components except for the sensing electrode pattern SR may be substantially the same as those previously described in association with FIG. 17 and, therefore, duplicative descriptions are not provided.

Figure 24:
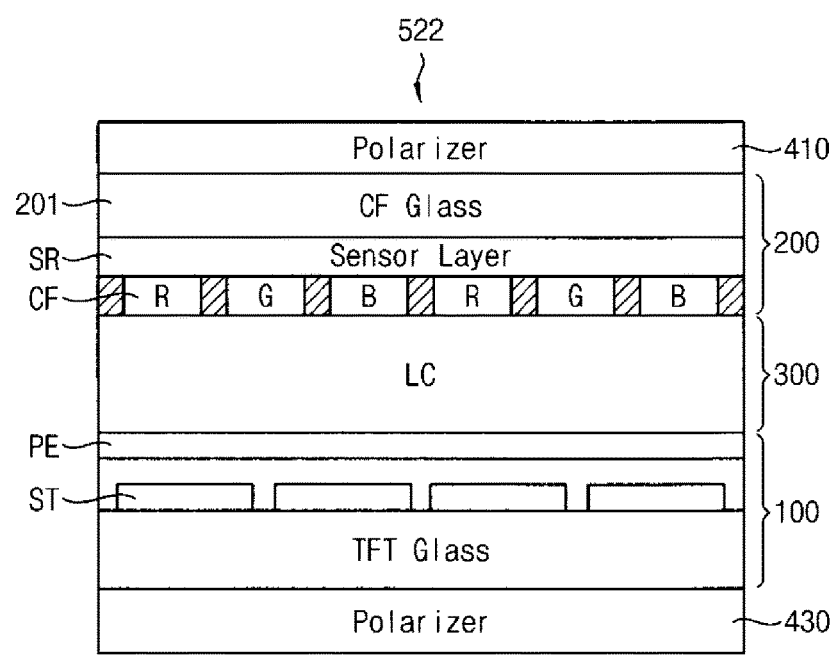
FIG. 24 is a cross-sectional view of a sensing display panel, according to exemplary embodiments.

FIG. 24 is a cross-sectional view of a sensing display panel, according to exemplary embodiments. As previously noted, same reference numerals are used to refer to the same or like components as those previously described. As such, corresponding descriptions are not repeated, unless furtherance of exemplary embodiments would be facilitated by such duplicative description.

With reference to FIGS. 17 and 24, the sensing display panel 522 includes the sensing electrode pattern SR, which is disposed between the base substrate 201 of the sensor substrate 200 and the color filter layer CF in comparison to the sensing display panel 520 described in association with FIG. 17.

According to exemplary embodiments, positions of the driving electrode pattern ST and pixel electrode PE are switched with one another in comparison to those positions described in association with the sensing display panel 520 of FIG. 17. In other words, according to exemplary embodiments, the driving electrode pattern ST may be disposed between the insulating layer 110 and the protecting layer 130, and the pixel electrode PE may be disposed on the protecting layer 130, with reference to FIG. 7.

The remainder of the components, except for the driving electrode pattern ST and the pixel electrode PE may be substantially the same as those described in association with FIG. 17 and, therefore, duplicative descriptions are not provided.

Figure 25:
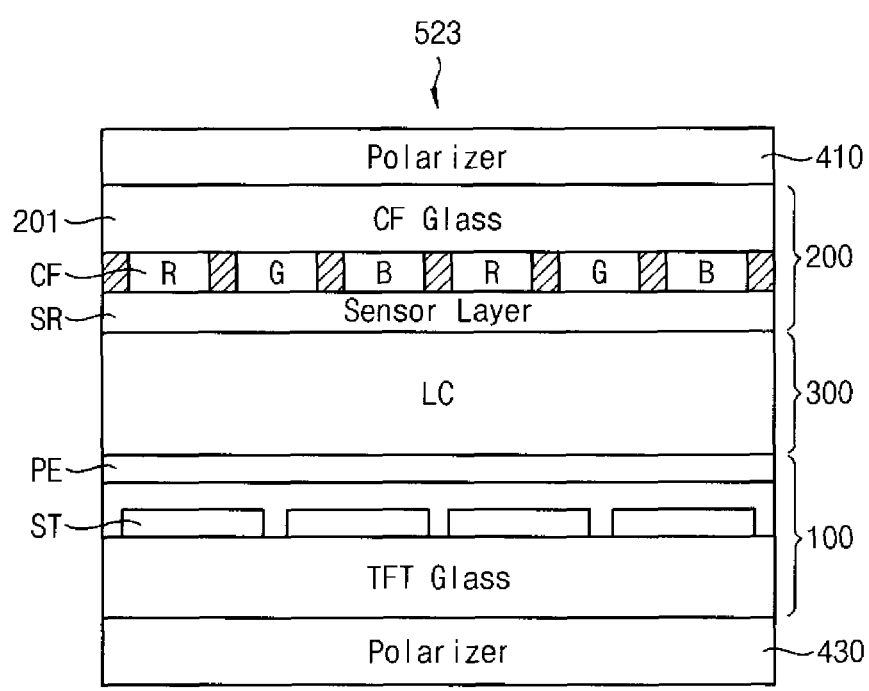
FIG. 25 is a cross-sectional view of a sensing display panel, according to exemplary embodiments.

FIG. 25 is a cross-sectional view of a sensing display panel, according to exemplary embodiments. As previously noted, same reference numerals are used to refer to the same or like components as those previously described. As such, corresponding descriptions are not repeated, unless furtherance of exemplary embodiments would be facilitated by such duplicative description.

With reference to FIGS. 17 and 25, the sensing display panel 523 includes the sensor layer SR disposed between the color filter layer CF and the liquid crystal layer 300, the driving electrode pattern disposed between the insulating layer 110 and the protecting layer 130, and the pixel electrode PE disposed on the protecting layer 130.

The remainder of the components, except for the sensor layer SR, the driving electrode pattern ST, and the pixel electrode PE may be substantially the same as those previously described in association with FIG. 17 and, therefore, duplicative descriptions are not be provided.

According to exemplary embodiments, the sensor substrate 200 includes at least one of the driving electrode patterns ST1, ST2, ST3, . . . , STN and the sensing electrode patterns SR1, SR2, SR3, . . . , SRM, which are formed with metal material so that the display apparatus may be protected from the deleterious effects associated static electricity. Accordingly, the display apparatus may be configured without conventional static electricity blocking layers typically utilized to block static electricity.

Further, the bias signal, such as the DC voltage exhibiting a predetermined voltage level or the ground voltage GND, may be applied to at least one of the driving electrode patterns ST1, ST2, ST3, . . . , STN and the sensing electrode patterns SR1, SR2, SR3, . . . , SRM, so that a static electricity blocking effect may be improved.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A sensing display panel, comprising:
a display substrate comprising:
a plurality of pixel electrodes disposed in a matrix formation, the matrix formation comprising a row direction and a column direction,
a driving electrode pattern comprising a plurality of unit patterns spaced apart from one another in the row direction and overlapping first pixel electrodes among the plurality of pixel electrodes,
a plurality of common electrode patterns spaced apart from and alternately arranged with the plurality of unit patterns in the row direction, the plurality of common electrode patterns overlapping second pixel electrodes among the plurality of pixel electrodes, the second pixel electrodes being different than the first pixel electrodes, each of the plurality of common electrode patterns longitudinally extending in the column direction, and
a common line extended in the row direction; and
a sensor substrate comprising:
a black matrix pattern comprising an area in which the plurality of pixel electrodes is disposed, the area corresponding to a light transmission area, and
a sensing electrode pattern comprising a plurality of lines connected to one another and overlapping the black matrix pattern, the sensing electrode pattern being separate and distinct from the plurality of common electrode patterns.

2. The sensing display panel of claim 1, wherein the display substrate comprises:
first to N-th driving electrode patterns, N being an integer greater than one;
first to M-th common electrode patterns arranged between corresponding unit patterns of the first to N-th driving electrode patterns, M being an integer greater than one;
first to N-th driving groups comprising at least one common line connected to the first to N-th driving electrode patterns; and
first to N-th common groups disposed between the first to N-th driving groups and comprising at least one common line connected to the first to M-th common electrode patterns.

3. The sensing display panel of claim 2, wherein each of the first to N-th driving electrode patterns and each of the first to M-th common electrode patterns is connected to the common line via at least one contact hole.

4. The sensing display panel of claim 2,
wherein a common voltage is caused to be applied to the first to N-th driving electrode patterns via the first to N-th driving groups during an active period of a frame, and
wherein a driving signal is caused to be sequentially applied to the first to N-th driving electrode patterns via the first to N-th driving groups during a blanking period of a frame.

5. The sensing display panel of claim 4,
wherein a common voltage is caused to be applied to the first to M-th common electrode patterns via the first to N-th common groups during an active period of a frame, and
wherein the common voltage is caused to be applied to the first to M-th common electrode patterns via the first to N-th common groups during a blanking period of a frame.

6. The sensing display panel of claim 1, wherein the display substrate further comprises:
a voltage line substantially parallel to the common line and arranged alternately with the common line.

7. The sensing display panel of claim 6, wherein the display substrate comprises:
first to N-th driving electrode patterns, N being an integer greater than one;
first to M-th common electrode patterns, M being an integer greater than one;
first to N-th driving groups comprising at least one common line connected to the first to N-th driving electrode patterns; and
first to N-th common groups disposed between the first to N-th driving groups and comprising at least one voltage line connected to the first to M-th common electrode patterns.

8. The sensing display panel of claim 7,
wherein each of the first to N-th driving electrode patterns is connected to the common line via at least one contact hole, and
wherein each of the first to N-th common electrode patterns is connected to the voltage line via at least one contact hole.

9. The sensing display panel of claim 8,
wherein a common voltage is caused to be applied to the first to N-th driving electrode patterns via the first to N-th driving groups during an active period of a frame, and
wherein a driving signal is caused to be sequentially applied to the first to N-th driving electrode patterns via the first to N-th driving groups during a blanking period of a frame.

10. The sensing display panel of claim 9,
wherein a common voltage is caused to be applied to the first to M-th common electrode patterns via the first to N-th common groups during an active period of a frame, and
wherein the common voltage is caused to be applied to the first to M-th common electrode patterns via the first to N-th common groups during a blanking period of a frame.

11. The sensing display panel of claim 9,
wherein a common voltage is caused to be applied to the first to M-th common electrode patterns via the first to N-th common groups during an active period of a frame, and
a voltage is caused to be blocked from being applied to the first to M-th common electrode patterns during a blanking period of a frame.

12. The sensing display panel of claim 1, wherein the sensor substrate comprises:
first to M-th sensing electrode patterns, and
wherein a direct current voltage exhibiting a predetermined voltage level is caused to be applied to at least some of the first to M-th sensing electrode patterns.

* * * * *